(12) United States Patent
Hu et al.

(10) Patent No.: US 11,600,592 B2
(45) Date of Patent: Mar. 7, 2023

(54) PACKAGE

(71) Applicant: Taiwan Semiconductor Manufacturing Company, Ltd., Hsinchu (TW)

(72) Inventors: Tian Hu, Hsinchu (TW); Hung-Jui Kuo, Hsinchu (TW); Yu-Hsiang Hu, Hsinchu (TW); Sih-Hao Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 93 days.

(21) Appl. No.: 17/155,044

(22) Filed: Jan. 21, 2021

(65) Prior Publication Data

US 2022/0230980 A1    Jul. 21, 2022

(51) Int. Cl.

| H01L 23/00 | (2006.01) |
|---|---|
| H01L 23/29 | (2006.01) |
| H01L 23/31 | (2006.01) |
| H01L 23/538 | (2006.01) |
| H01L 21/48 | (2006.01) |
| H01L 21/56 | (2006.01) |
| H01L 21/683 | (2006.01) |

(52) U.S. Cl.
CPC .......... *H01L 24/20* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/293* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 2221/68372* (2013.01); *H01L 2224/214* (2013.01)

(58) Field of Classification Search
CPC . H01L 24/20; H01L 21/4853; H01L 21/4857; H01L 21/565; H01L 21/568; H01L 21/6835; H01L 23/293; H01L 23/3128; H01L 23/5383; H01L 23/5386; H01L 23/5389; H01L 24/19; H01L 2221/68372; H01L 2224/214
See application file for complete search history.

(56) References Cited

U.S. PATENT DOCUMENTS

| 8,987,922 B2 | 3/2015 | Yu et al. |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |

(Continued)

*Primary Examiner* — Fernando L Toledo
*Assistant Examiner* — Neil R Prasad
(74) *Attorney, Agent, or Firm* — JCIPRNET

(57) ABSTRACT

A package includes a die and a redistribution layer. A top surface of the die has a first area and a second area connected with the first area. The redistribution layer structure includes a first insulation layer, a redistribution layer, and a second insulation layer. The first insulation layer is overlapping with the second area. The redistribution layer is disposed above the die. The second insulation layer is disposed above the redistribution layer and overlapping with the second area and the first area. The second insulation layer covers a top surface of the first insulation layer and is in contact with a side surface of the first insulation layer and the top surface of the die.

20 Claims, 25 Drawing Sheets

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,196,532 B2 | 11/2015 | Tu et al. | |
| 9,196,559 B2 | 11/2015 | Tsai et al. | |
| 9,257,333 B2 | 2/2016 | Lu et al. | |
| 9,263,511 B2 | 2/2016 | Yu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2017/0256496 A1* | 9/2017 | Lin | H01L 21/4853 |
| 2020/0211425 A1* | 7/2020 | Yamazaki | H01L 29/78648 |
| 2020/0243497 A1* | 7/2020 | Hsu | H01L 24/20 |
| 2021/0313498 A1* | 10/2021 | Kim | H01L 29/78633 |

\* cited by examiner

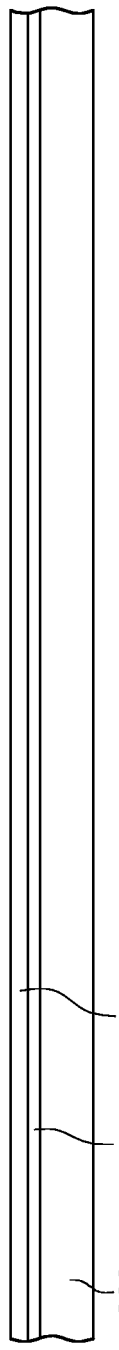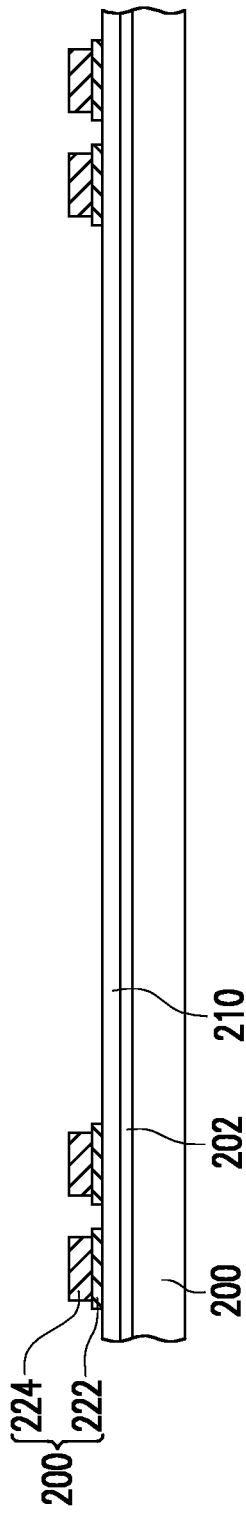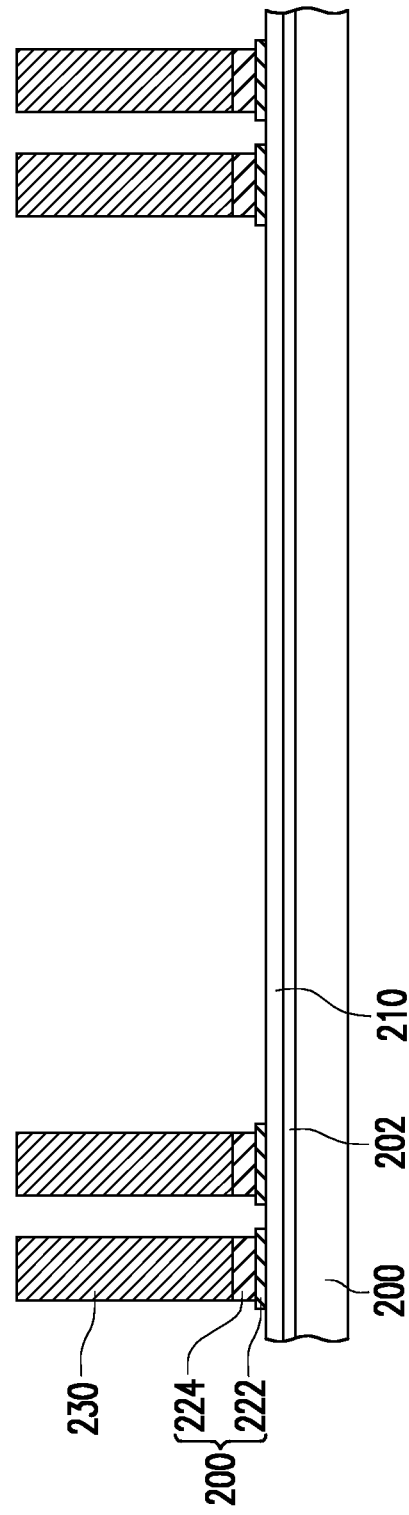

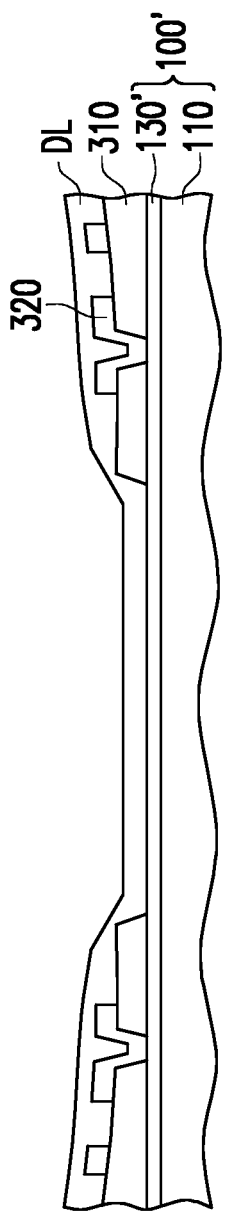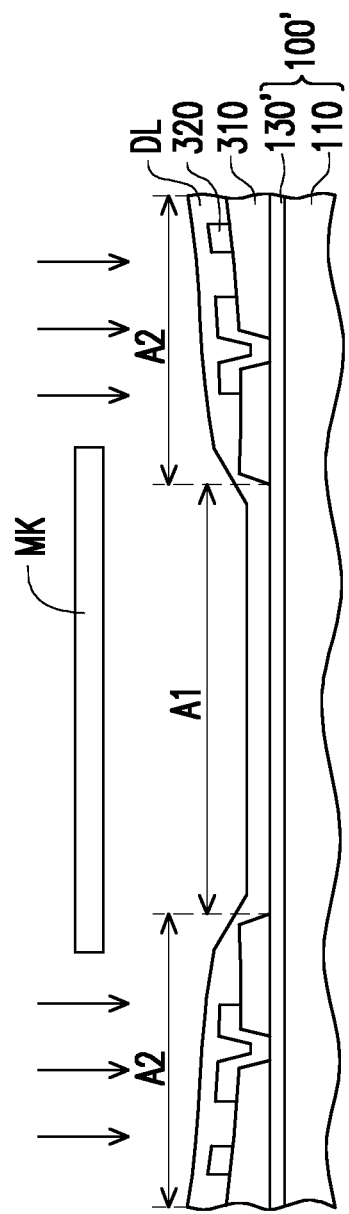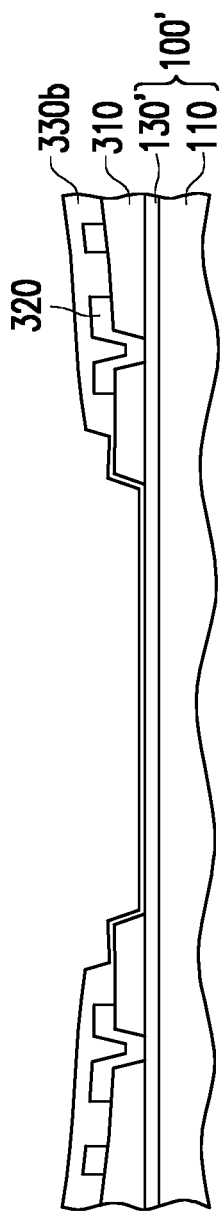
FIG. 7A
FIG. 7B
FIG. 7C

PACKAGE

BACKGROUND

The semiconductor industry has experienced rapid growth due to continuous improvements in the integration density of various electronic components (e.g., transistors, diodes, resistors, capacitors, sensors, etc.). For the most part, the improvement in integration density has come from repeated reductions in minimum feature size, which allows more of the smaller components to be integrated into a given area.

Currently, integrated fan-out (InFO) packages are becoming increasingly popular for their high integration level. The integrated fan-out packages typically include a redistribution circuit structure laying over a molding compound and a molded integrated circuit, so that electrical contacts can be made on a larger pitch than contact pads of the molded integrated circuit. In order to meet the requirements for smaller sizes and higher packing densities, the manufacturing method for the redistribution circuit structure has become an important issue in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1L are schematic cross-sectional views illustrating a fabrication method of a package in accordance with some embodiments of the disclosure.

FIG. 7A through FIG. 7C are schematic cross-sectional views illustrating a fabrication method of an insulation layer in accordance with some embodiments of the disclosure.

DETAILED DESCRIPTION

Figure 1A:
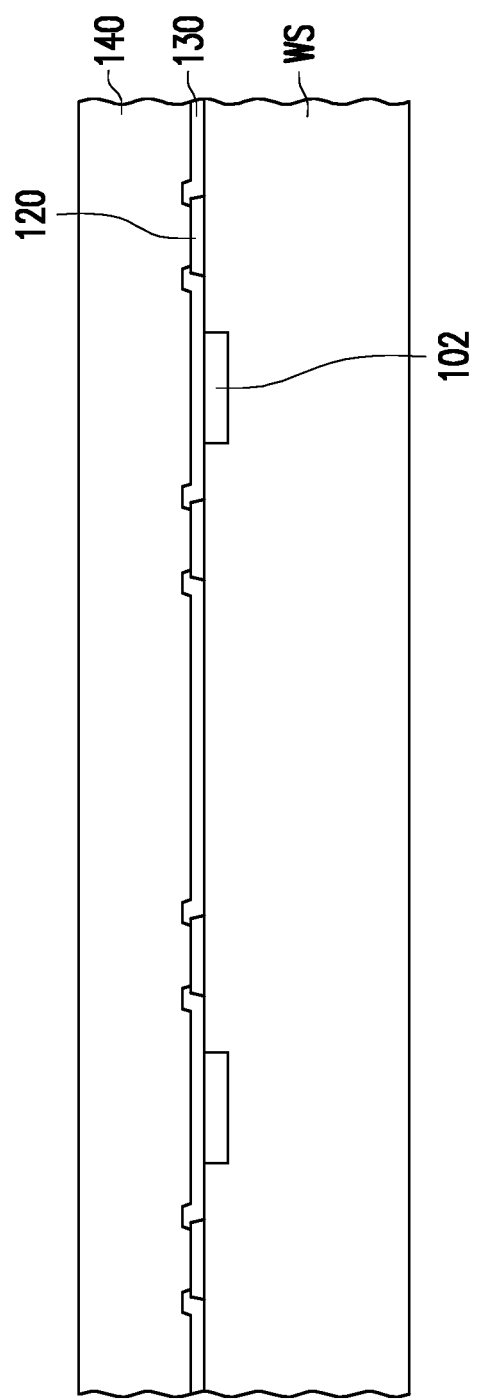

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1L are schematic cross-sectional views illustrating a fabrication method of a package 10 in accordance with some embodiments of the disclosure.

Referring to FIG. 1A, a semiconductor wafer WS is provided. In some embodiments, the semiconductor wafer WS may be made of elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor wafer WS includes active components (e.g., transistors or the like) and/or passive components (e.g., resistors, capacitors, inductors, or the like) formed therein.

As illustrated in FIG. 1A, a plurality of sensing components 102, a plurality of conductive pads 120, and a protection layer 130 are disposed on the semiconductor wafer WS. In some embodiments, the sensing components 102 are located between adjacent conductive pads 120. For example, the conductive pads 120 surround the corresponding sensing component 102. In some embodiments, a material of the protection layer 130 includes silicon nitride, silicon oxide, polyimide, polybenzoxazole (PBO), or the like.

Although FIG. 1A illustrated that the sensing components 102 are embedded in the semiconductor wafer WS while being coplanar with the top surface of the semiconductor wafer WS, the disclosure is not limited thereto. In some alternative embodiments, the sensing components 102 may be disposed over a top surface of the semiconductor wafer WS. That is, there is a height difference between top surfaces of the sensing components 102 and the top surface of the semiconductor wafer WS.

In some embodiments, the sensing components 102 may be ultrasonic sensors which sense the vibration of air or sound. However, the disclosure is not limited thereto. In some alternative embodiments, the sensing components 102 may be photo sensors, fingerprint sensors, or the like. In some embodiments, a material of the conductive pads 120 includes aluminum, titanium, copper, nickel, tungsten, and/or alloys thereof. The conductive pads 120 may be formed by, for example, electroplating, deposition, and/or photolithography and etching. It should be noted that the number of the sensing components 102 and the number of the conductive pads 120 shown in FIG. 1A are merely exemplary illustrations, and the disclosure is not limited thereto. In some alternative embodiments, the number of the sensing components 102 and the number of the conductive pads 120 may be adjusted depending on the routing requirements.

In some embodiments, the protection layer 130 is formed on the semiconductor wafer WS, the conductive pads 120, and the sensing components 102. The protection layer 130 partially covers the conductive pads 120. For example, the protection layer 130 exposes at least a portion of each conductive pad 120 for future electrical connection. In some embodiments, the protection layer 130 may be an insulation layer to protect the conductive pads 120. In some embodiments, a material of the protection layer 130 includes silicon nitride, silicon oxide, or the combination thereof. The protection layer 130, for example, may be formed by suitable fabrication techniques such as chemical vapor deposition (CVD), plasma-enhanced chemical vapor deposition (PECVD), physical vapor deposition (PVD), sol-gel process, atomic Layer Deposition (ALD), or the like. In some embodiments, the conductive pads 120 are electrically connected with the sensing components 102 through circuits (not shown) on the semiconductor wafer WS.

A sacrificial material layer 140 is formed over the semiconductor wafer WS to cover the sensing components 102, the conductive pads 120, and the protection layer 130. In some embodiments, a composition for the sacrificial material layer 140 includes a polymer, a solvent, and a plasticizer compound. In some embodiments, the composition for the sacrificial material layer 140 may optionally include a crosslinking agent.

Figure 1B:
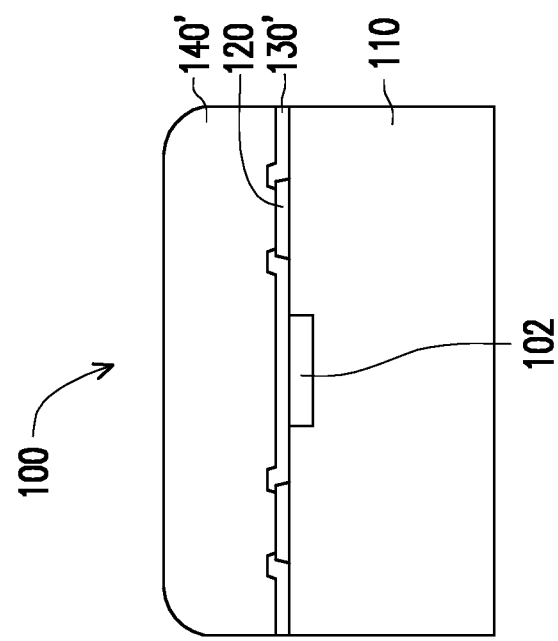

Referring to FIG. 1B, a dicing process or a singulation process is performed on the semiconductor wafer WS to obtain a plurality of dies 100. In some embodiments, the dicing process or the singulation process typically involves dicing with a rotating blade or a laser beam. In other words, the dicing process or the singulation process is, for example, a laser cutting process, a mechanical cutting process, or other suitable processes. In some embodiments, a portion of the sacrificial material layer 140 is removed to form a plurality of sacrificial films 140', and a portion of the protection layer 130 is removed to form a plurality of protection layer 130'.

At this stage, each die 100 includes the semiconductor substrate 110, the sensing component 102, the conductive pads 120, the protection layer 130', and the sacrificial film 140'. The sensing component 102 is disposed on the semiconductor substrate 110 or embedded in the semiconductor substrate 110. The conductive pads 120 are disposed on the semiconductor substrate 110. The protection layer 130' is disposed above the semiconductor substrate 110. In some embodiments, the thickness of the semiconductor substrate 110 is in a range between 100 micrometer to 700 micrometer.

Referring to FIG. 1C, a carrier substrate 200 having a de-bonding layer 202 and a dielectric layer 210 formed thereon is provided. In some embodiments, the de-bonding layer 202 and the dielectric layer 210 are formed above a top surface of the carrier substrate 200, and the de-bonding layer 202 is located between the carrier substrate 200 and the dielectric layer 210. For example, the carrier substrate 200 may be a glass substrate and the de-bonding layer 202 may be a light-to-heat conversion (LTHC) release layer formed on the glass substrate. However, the disclosure is not limited thereto. In some alternative embodiments, other suitable materials may be adapted for the carrier substrate 200 and the de-bonding layer 202.

In some embodiments, a material of the dielectric layer 210 includes polyimide, epoxy resin, acrylic resin, benzocyclobutene (BCB), polybenzoxazole (PBO), or any other suitable polymer-based dielectric material. The dielectric layer 210, for example, may be formed by suitable fabrication techniques such as spin-on coating, CVD, PECVD, or the like. In some embodiments, a thickness of the dielectric layer 210 is in a range between 2 micrometer to 35 micrometer.

Referring to FIG. 1D, a plurality of seed layer patterns 222 and a plurality of conductive material patterns 224 are sequentially formed over the dielectric layer 210. In some embodiments, a fabrication method of the seed layer patterns 222 and the conductive material patterns 224 may include the following steps. First, a seed material layer (not shown) is blanketly and conformally formed over the dielectric layer 210. In some embodiments, the seed material layer includes at least one of titanium, titanium nitride, tantalum, tantalum nitride, copper, and copper alloys. In some embodiments, the seed material layer is formed by physical vapor deposition (PVD), sputtering, or other applicable methods. After the seed material layer is formed over the dielectric layer 210, a mask layer (not shown) having openings partially exposing the seed material layer is formed on the seed material layer. In some embodiments, the mask layer may be a photoresist or a dry film. Thereafter, a conductive material layer (not shown) is filled into the openings of the mask layer. That is, the conductive material layer is formed on the portion of the seed material layer exposed by the openings of the mask layer. The conductive material layer includes, for example, copper, copper alloys, or the like. In some embodiments, the conductive material layer may be formed by a plating process, for example, electro-plating, electroless-plating, immersion plating, or the like. After the plating process, a grinding process is performed on the conductive material layer. The grinding process includes, for example, a mechanical grinding process, a chemical mechanical polishing (CMP) process, or the like. However, the disclosure is not limited thereto. In some alternative embodiments, the grinding process may be omitted. Subsequently, the mask layer is removed through a stripping process, an etching process, and/or a cleaning process. Upon removal of the mask layer, a portion of the seed material layer is exposed.

For example, the seed material layer not covered by the conductive material layer is exposed. Then, the exposed portion of the seed material layer may be removed through an etching process to form the seed layer patterns 222 and the conductive material patterns 224.

In some embodiments, the seed layer patterns 222 and the conductive material patterns 224 may be collectively referred to as a redistribution structure 220. In some embodiments, the seed layer patterns 222 may have single-layer structure or multi-layer structure, and the conductive material patterns 224 may have single-layer structure or multi-layer structure.

Referring to FIG. 1E, a plurality of through insulating vias (TIVs) 230 are formed over the redistribution structure 220. For example, the TIVs 230 are directly in contact with the conductive material patterns 224. In some embodiments, a material of the TIVs 230 includes copper, copper alloys, or the like. The TIVs 230 and the conductive material patterns 224 may be made of the same material or different materials. In some embodiments, the TIVs 230 are formed on the redistribution structure 220 through a plating process. For example, a seed layer (not shown) is first formed on top surfaces of the conductive material patterns 224. Thereafter, the TIVs 230 are plated onto the seed layer over the top surfaces of the conductive material patterns 224. However, the disclosure is not limited thereto. In some alternative embodiments, the TIVs 230 may be plated onto top surfaces of the conductive material patterns 224 while utilizing the seed layer patterns 222 as the seed layer. Under this scenario, the exposed portion of the seed material layer discussed in FIG. 1D is not removed prior to the formation of TIVs 230. That is, the TIVs 230 may be plated by utilizing the seed material layer discussed in FIG. 1D as a seed layer. After the TIVs 230 are formed, the exposed portion of the seed material layer is removed to form the seed layer patterns 222. In some embodiments, the plating process includes, electro-plating, electroless-plating, immersion plating, or the like. However, the disclosure is not limited thereto.

In some alternative embodiments, the TIVs 230 may be formed by pick and place pre-fabricated TIVs onto the conductive material patterns 224. In some embodiments, a width/diameter of each TIV 230 may be substantially the same as a width of the conductive material patterns 224. However, the disclosure is not limited thereto. In some alternative embodiments, the width/diameter of each TIV 230 is smaller than the width of the conductive material patterns 224. In some embodiments, the width/diameter of each TIV 230 is in a range between 100 micrometer to 400 micrometer. In some embodiments, the thickness of each TIV 230 is in a range between 100 micrometer to 700 micrometer.

Figure 1F:
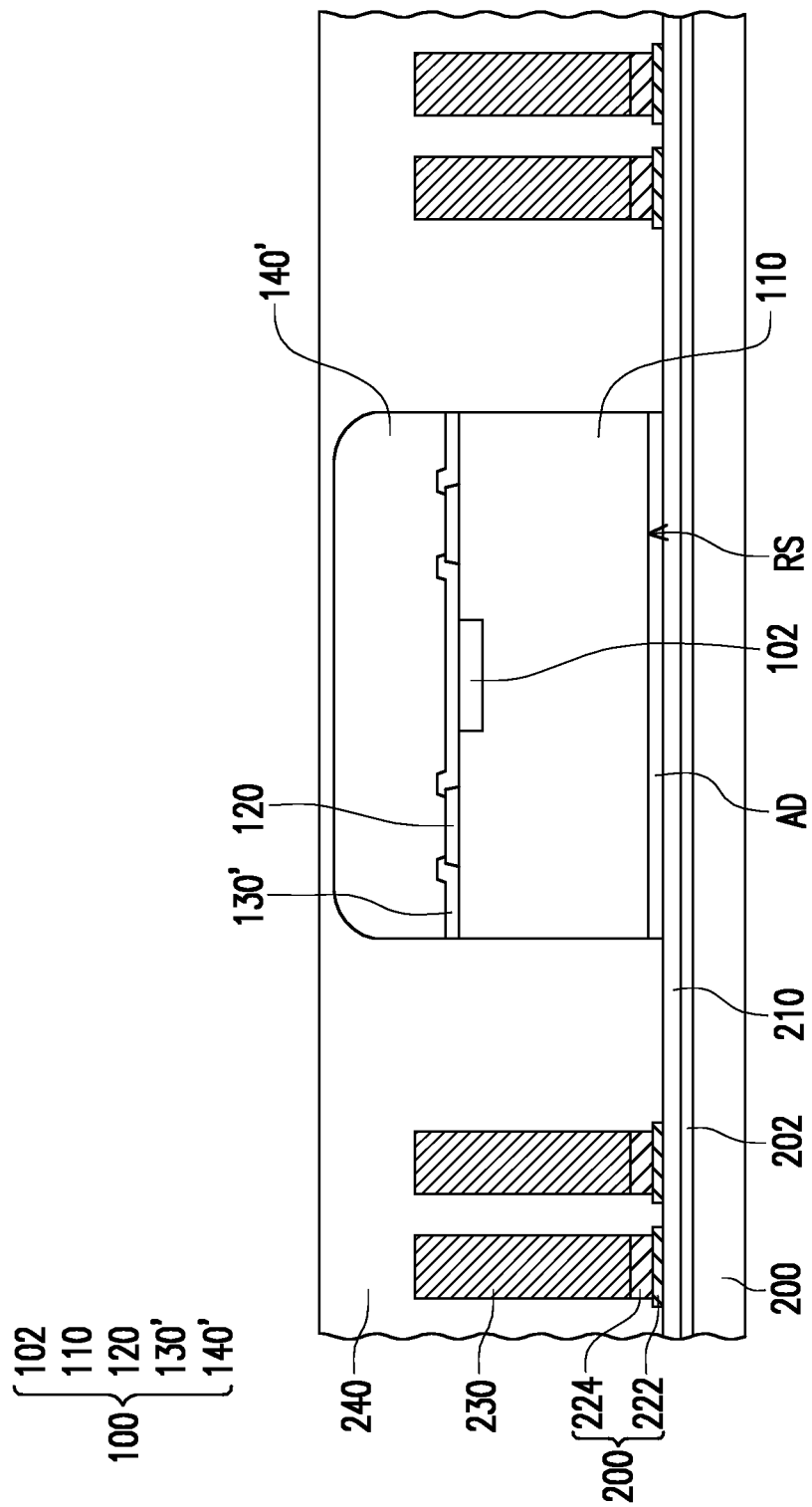

Referring to FIG. 1F, the die 100 shown in FIG. 1B is placed over the carrier substrate 200. For example, the die 100 is picked-and-placed onto the dielectric layer 210. In some embodiments, the die 100 is attached to the dielectric layer 210 through an adhesive layer AD. In other words, the rear surface RS of the die 100 is attached to the adhesive layer AD. In some embodiments, the adhesive layer AD may include a die attach film (DAF). For simplicity, one die 100 is shown in FIG. 1F. However, it should be understood that multiple dies 100 may be placed over the carrier substrate 200 to arrange in an array. In some embodiments, the TIVs 230 surround the die 100. In some embodiments, the thickness of the adhesive layer AD is in a range between 5 micrometer to 50 micrometer.

In some embodiments, the TIVs 230 are formed over the redistribution structure 220 prior to the placement of the die 100 over the carrier substrate 200. However, the disclosure is not limited thereto. In some alternative embodiments, the die 100 may be placed over the carrier substrate 200 before forming the TIVs 230 over the redistribution structure 220.

An encapsulation material 240 is formed over the dielectric layer 210 to encapsulate the die 100, the redistribution structure 220, the adhesive layer AD, and the TIVs 230. In some embodiments, the encapsulation material 240 is a molding compound, a molding underfill, a resin (such as epoxy), or the like. In some alternative embodiments, the encapsulation material 240 includes a photosensitive material such as PBO, polyimide, BCB, a combination thereof, or the like. In some embodiments, the encapsulation material 240 may be formed by a molding process, such as a compression molding process. In some embodiments, fillers (not shown) are embedded in the encapsulation material 240 to enhance the mechanical strength of the package. In some embodiments, the encapsulation material 240 may be free of filler. As illustrated in FIG. 1F, the die 100 and the TIVs 230 are not revealed and are well protected by the encapsulation material 240.

Figure 1G:
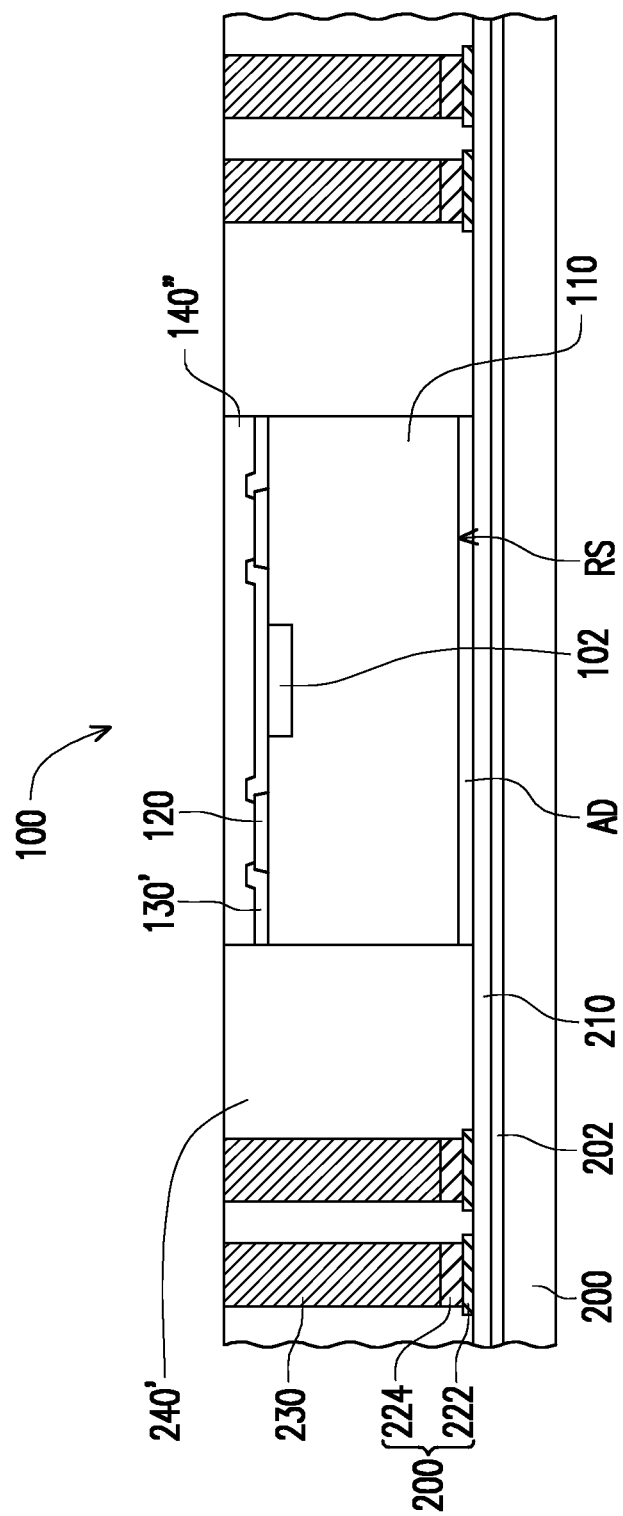

Referring to FIG. 1G, the encapsulation material 240 is grinded until the top surface of the die 100 and the top surfaces of the TIVs 230 are exposed. In other words, the encapsulation material 240 is grinded until the sacrificial film 140' and the TIVs 230 are exposed. After the encapsulation material 240 is grinded, an encapsulant 240' is formed over the dielectric layer 210 to laterally encapsulate the die 100, the adhesive layer AD, the redistribution structure 220, and the TIVs 230. In some embodiments, the encapsulation material 240 is grinded by a mechanical grinding process and/or a CMP process. In some embodiments, after the top surface of the die 100 and the top surfaces of the TIVs 230 are revealed, the grinding process may continue such that a portion of the sacrificial film 140' are removed to form the sacrificial film 140". In some embodiments, the grinding process may continue such that portions of the TIVs 230 are slightly grinded as well.

Figure 1H:
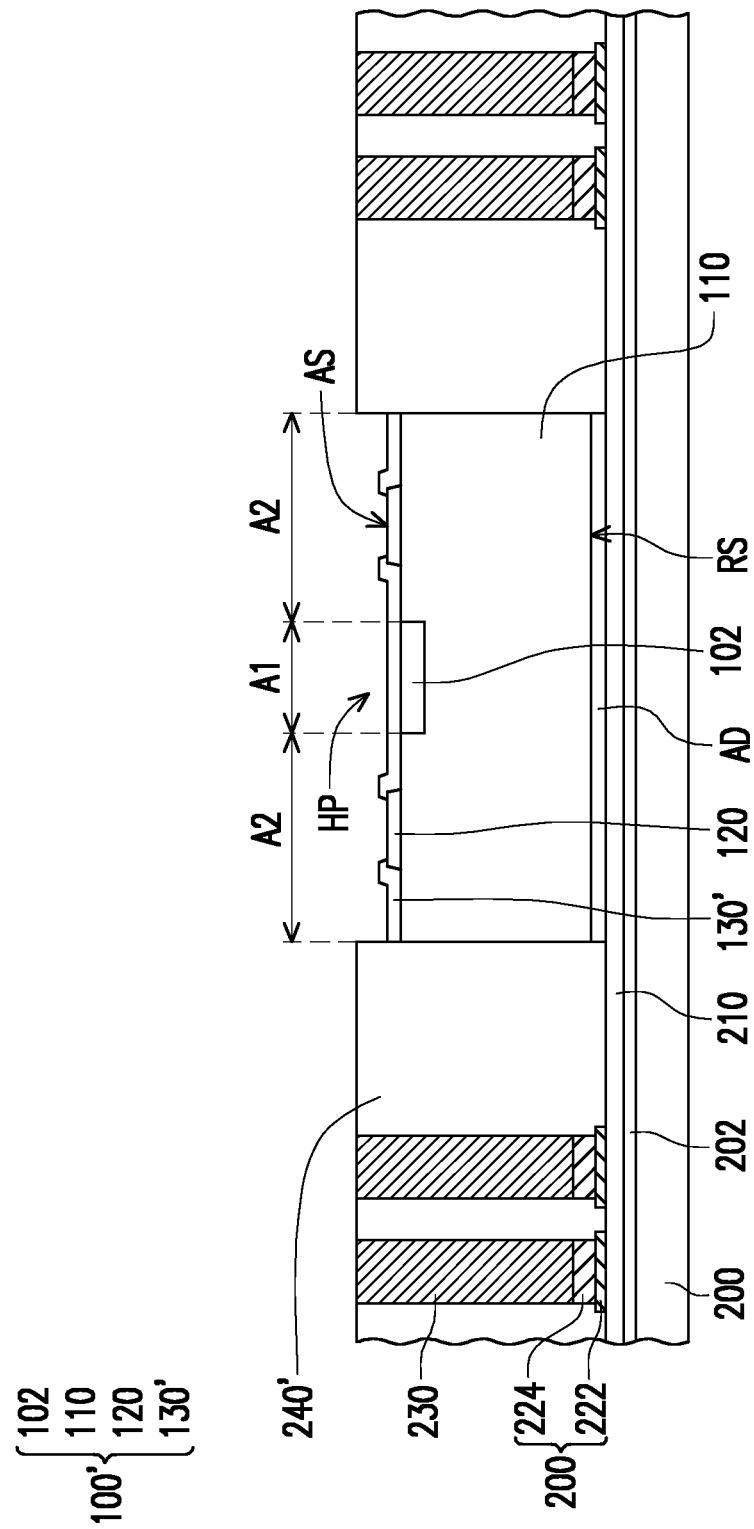

Referring to FIG. 1H, the sacrificial film 140" is removed to form a die 100' revealed by the encapsulant 240'. In some embodiments, the sacrificial film 140" is removed through a wet process. For example, the sacrificial film 140" may be removed by solutions utilized in a stripping process. After removing the sacrificial film 140", a hollow portion HP in the encapsulant 240' is form to exposed a top surface AS of the die 100'. In some embodiments, the die 100' includes the semiconductor substrate 110, the sensing component 102, the conductive pads 120, and the protection layer 130'. In some embodiments, the top surface AS of the die 100' may be referred to as an active surface of the die 100'. The top surface AS of the die 100' has a first area A1 and a second area A2 connected with the first area A1. In some embodiments, the second area A2 surrounds the first area A1. In some embodiments, the first area A1 is a sensing area overlapping with the sensing component 102, and the second area A2 is a non-sensing area.

Figure 1I:
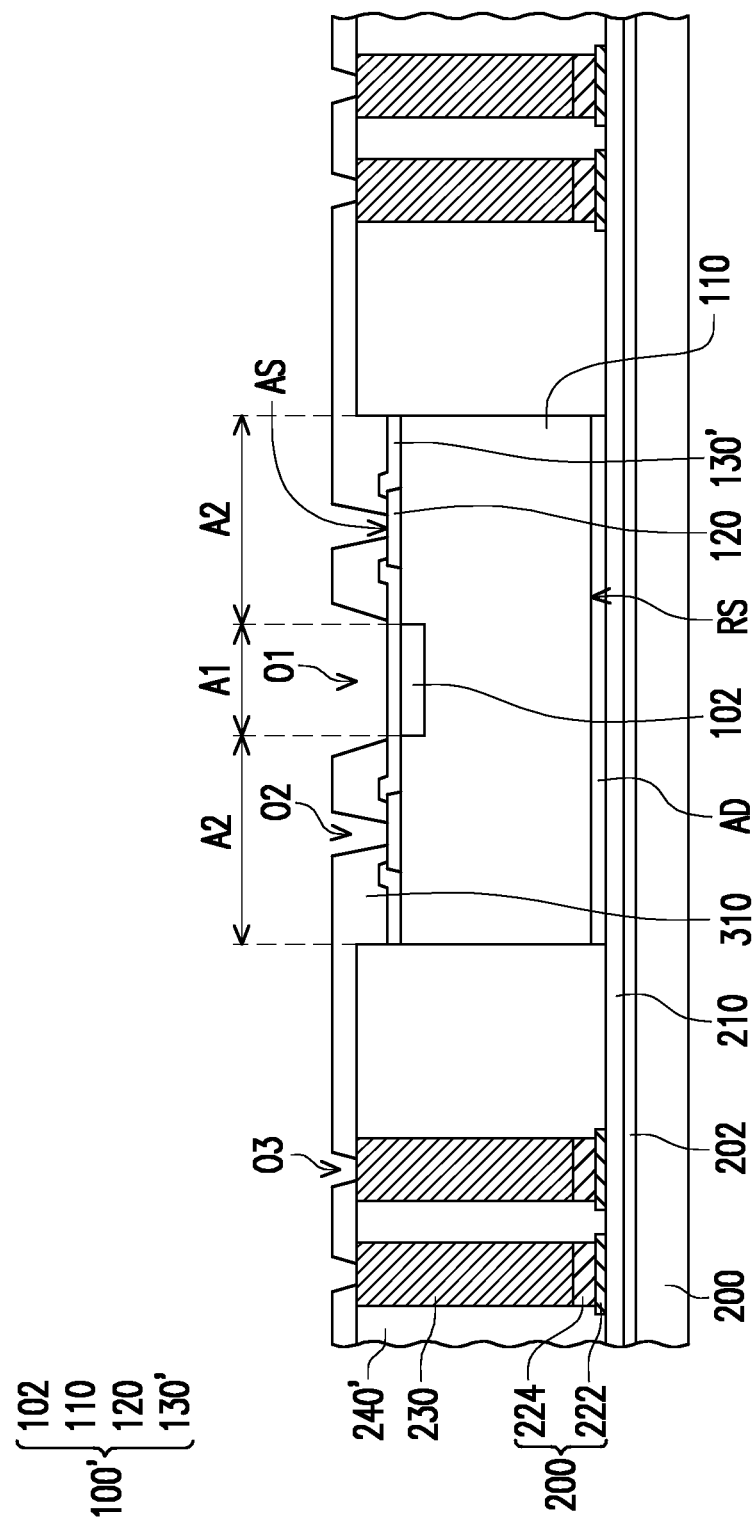

Referring to FIG. 1I, a first insulation layer 310 is formed over the encapsulant 240', the TIVs 230 and the die 100'. In some embodiments, a material of the first insulation layer 310 includes polyimide, epoxy resin, acrylic resin, benzocyclobutene (BCB), polybenzoxazole PBO, or any other suitable polymer-based dielectric material.

In some embodiments, the first insulation layer 310 may be formed by the following steps. First, a dielectric material layer (not shown) is formed over the encapsulant 240', the TIVs 230 and the die 100' by suitable fabrication techniques such as spin-on coating, lamination, blade-coating, or the like. A top surface of the encapsulant 240', a top surface of the TIVs 230, the hollow portion HP in the encapsulant 240' and the top surface AS of the die 100' are covered by the dielectric material layer. Subsequently, the dielectric material layer is patterned by a photolithography process and/or an etching process to form the first insulation layer 310 including a first opening O1, a plurality of second openings O2, and a plurality of third openings O3. The first area A1 overlapping with the sensing component 102 is revealed by the first openings O1 and thereby preventing the first insulating layer 310 from causing negative impact on the sensing quality. In some embodiments, the first insulation layer 310 is overlapping with the second area A2 and is not overlapping with the first area A1. The conductive pads 120 are exposed by the first openings O1 and the TIVs 230 are exposed by the third openings O3. In some embodiments, a thickness of the first insulation layer 310 is in a range between 2 micrometer to 30 micrometer.

Figure 1J:
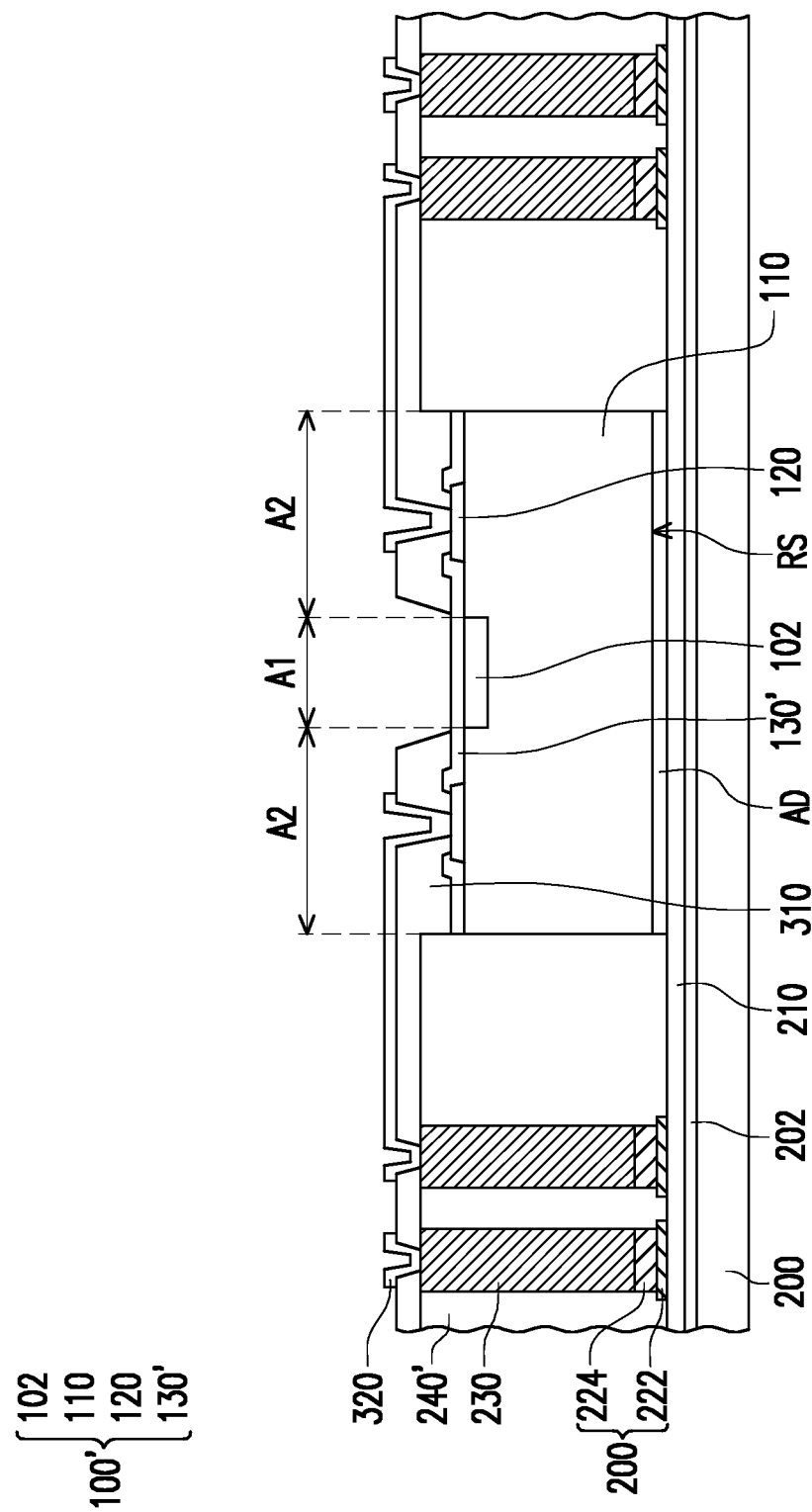

Referring to FIG. 1J, a redistribution layer 320 is formed above the die 100'. In some embodiments, the redistribution layer 320 is formed above the first insulation layer 310. The redistribution layer 320 is electrically connected with the conductive pads 120 through vias in the protection layer 310 and vias (the first openings O1) in the first insulating layer 310. In addition, the redistribution layer 320 is electrically connected with the TIVs 230 through vias (the second openings O2) in the first insulating layer 310. In some embodiments, a portion of the redistribution layer 320 is extending from the TIVs 230 to the conductive pads 120 so as to electrically connect the TIVs 230 to the conductive pads 120. In some embodiments, the first area A1 is not covered by the redistribution layer 320.

In some embodiments, the redistribution layer 320 includes a seed layer conformally formed over the first insulating layer 310 and a metal layer formed on the seed layer. In some embodiments, the seed layer may include at least one of titanium, titanium nitride, tantalum, tantalum nitride, copper, and copper alloys. In some embodiments, the seed layer is deposited by PVD, sputtering, or other application methods. The metal layer may be formed on the seed layer through electro-plating, electroless-plating, immersion plating, or the like. In some embodiments, a material of the metal layer includes aluminum, titanium, copper, nickel, tungsten, and/or alloys thereof. In some embodiments, a patterned photoresist layer may be formed on the first insulating layer 310 so as to define the pattern of the redistribution layer 320. In some embodiments, a thickness of the redistribution layer 320 is in a range between 1 micrometer to 200 micrometer.

Figure 1K:
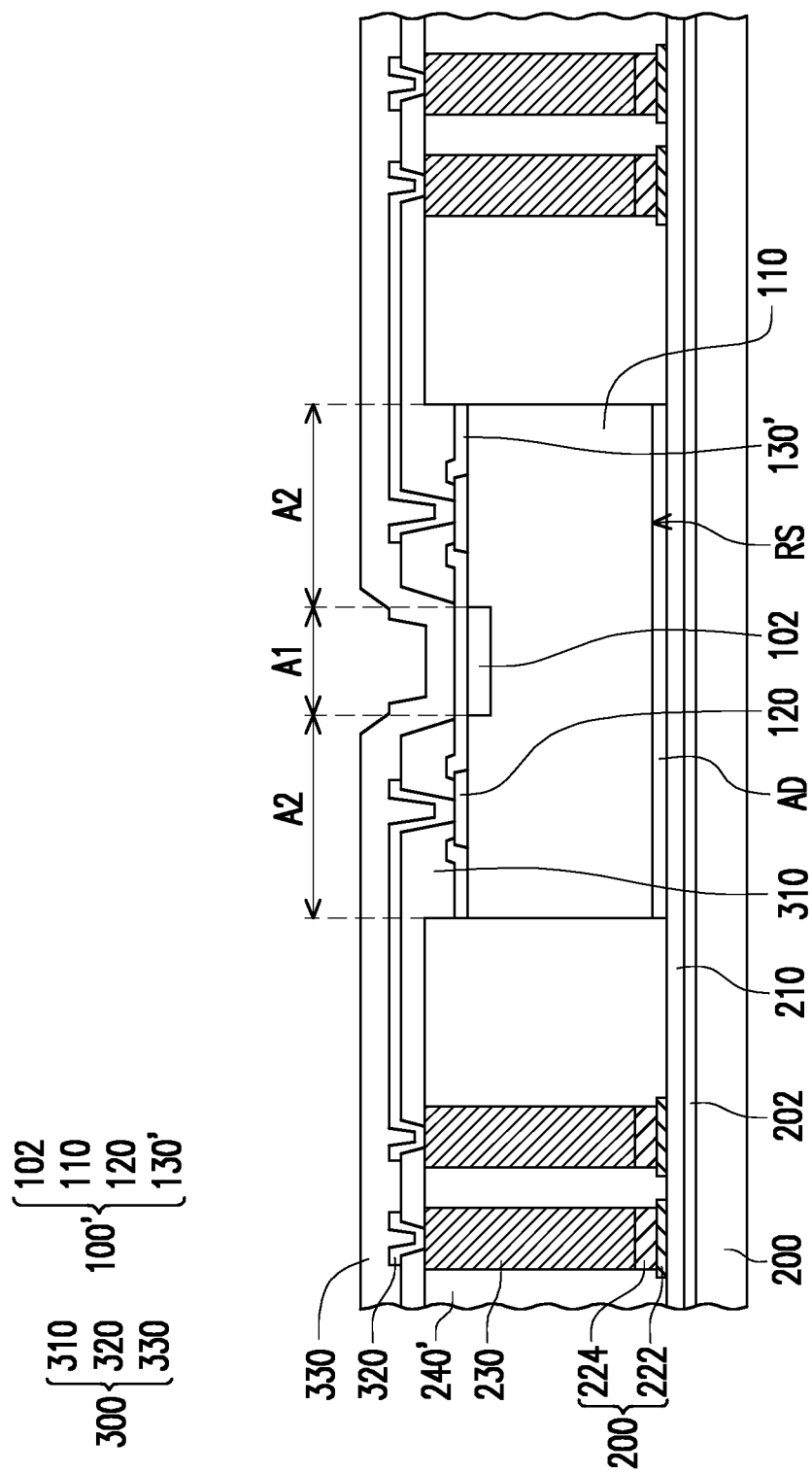

Referring to FIG. 1K, a second insulation layer 330 is formed over the redistribution layer 320, the first insulating layer 310 and the die 100'. In some embodiments, the second insulation layer 330 is overlapping with the second area A2 and the first area A1. The second insulation layer 330 covers the first area A1 of the top surface AS of the die 100'. The second insulation layer 330 is in contact with a side surface of the first insulation layer 310 and the top surface AS of the die 100' so as to protect the interface between the first insulating layer 310 and the die 100' from being damaged by a clean agent used in subsequent processes.

In some embodiments, a material of the second insulation layer 330 includes polyimide, epoxy resin, acrylic resin, benzocyclobutene (BCB), polybenzoxazole PBO, or any other suitable polymer-based dielectric material. In some embodiments, the first insulating layer 310 and the second insulation layer 330 are made of the same or similar material.

In some embodiments, the second insulation layer 330 is formed over the first insulating layer 310, the redistribution layer 320 and the die 100' by suitable fabrication techniques such as spin-on coating, lamination, blade-coating, or the like. A top surface of the first insulating layer 310, a side surface of the first insulating layer 310 near the first area A1, a top surface of the redistribution layer 320 and a portion of the protection layer 130' are covered by the second insulation layer 330. In some embodiments, a thickness of the second insulation layer 330 is in a range between 2 micrometer to 30 micrometer.

In some embodiments, the second insulation layer 330 can be fabricated without performing a descum process and a photolithography process to reduce the cost of fabrication. However, the disclosure is not limited thereto.

At this stage, a redistribution layer structure 300 including the first insulating layer 310, the redistribution layer 320 and the second insulation layer 330 is formed.

In some embodiments, one redistribution layer 320 is disposed between the first insulating layer 310 and the second insulation layer 330, and is encapsulated by the first insulating layer 310 and the second insulation layer 330. However, the disclosure is not limited thereto. In other embodiment, a plurality of redistribution layers alternately stacked with a plurality of insulating layers are disposed between the first insulating layer 310 and the second insulation layer 330. That is, the redistribution layer structure 300 may include a plurality of redistribution layers.

Figure 1L:
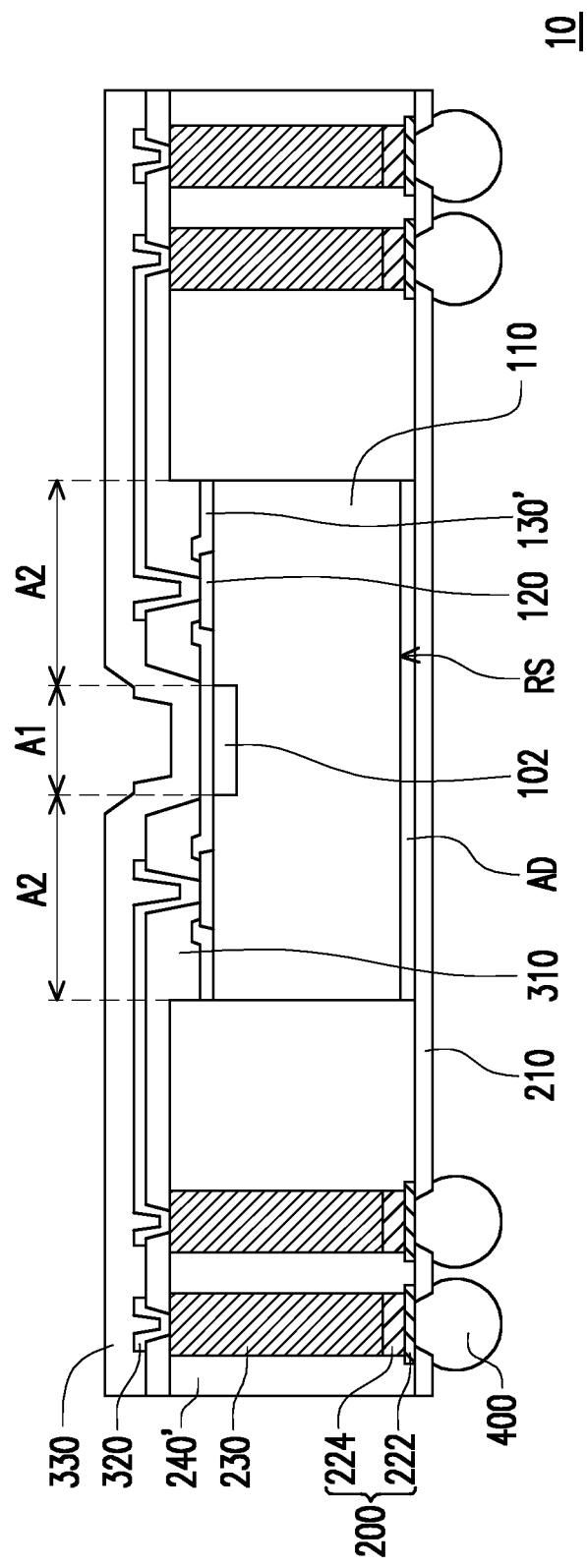

Referring to FIG. 1L, the dielectric layer 210 is de-bonded from the de-bonding layer 202 such that the dielectric layer 210 is separated from the carrier substrate 200. That is, the de-bonding layer 202 and the carrier substrate 200 are removed. In some embodiments, the de-bonding layer 202 (e.g., the LTHC release layer) may be irradiated by an UV laser such that the dielectric layer 210 may be peeled off from the carrier substrate 200.

The dielectric layer 210 is patterned to form a plurality of contact openings partially exposing the redistribution structure 220. In some embodiments, the contact openings of the dielectric layer 210 are formed by a laser drilling process, a mechanical drilling process, or other suitable processes.

After the contact openings are formed in the dielectric layer 210, a plurality of conductive terminals 400 are formed in the contact openings such that the conductive terminals 400 are electrically connected to the TIVs 230 through the redistribution structure 220. In some embodiments, the conductive terminals 400 are, for example, solder balls, ball grid array (BGA) balls, or controlled collapse chip connection (C4) bumps. In some embodiments, the conductive terminals 400 are made of a conductive material with low resistivity, such as Sn, Pb, Ag, Cu, Ni, Bi, or an alloy thereof. In some embodiments, a diameter of each conductive terminal 400 is in a range between 20 micrometer to 300 micrometer.

After the conductive terminals 400 are formed, a dicing process or a singulation process is performed to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes.

In some embodiments, the package 10 includes the dielectric layer 210, the TIVs 230, the encapsulant 240', the die 100', the redistribution layer structure 300, and the conductive terminals 400. In some embodiments, the package 10 is an integrated fan-out (InFO) package that the redistribution layer structure 300 is laying over the encapsulant 240' and the die 100' molded by the encapsulant 240'.

In some embodiments, a clean process is performed on the package 10 to remove stains or byproducts generated in the manufacturing process of the package 10, for example, after forming the conductive terminals 400. Since the second insulation layer 330 is in contact with the side surface of the first insulation layer 310 and the top surface of the die 100', the clean agent used in the clean process will not infiltrate into the interface between the first insulation layer 310 and the die 100', thereby a delamination problem of the first insulation layer 310 can be solved. Therefore, reliability of the package 10 can be improved.

Figure 2A:
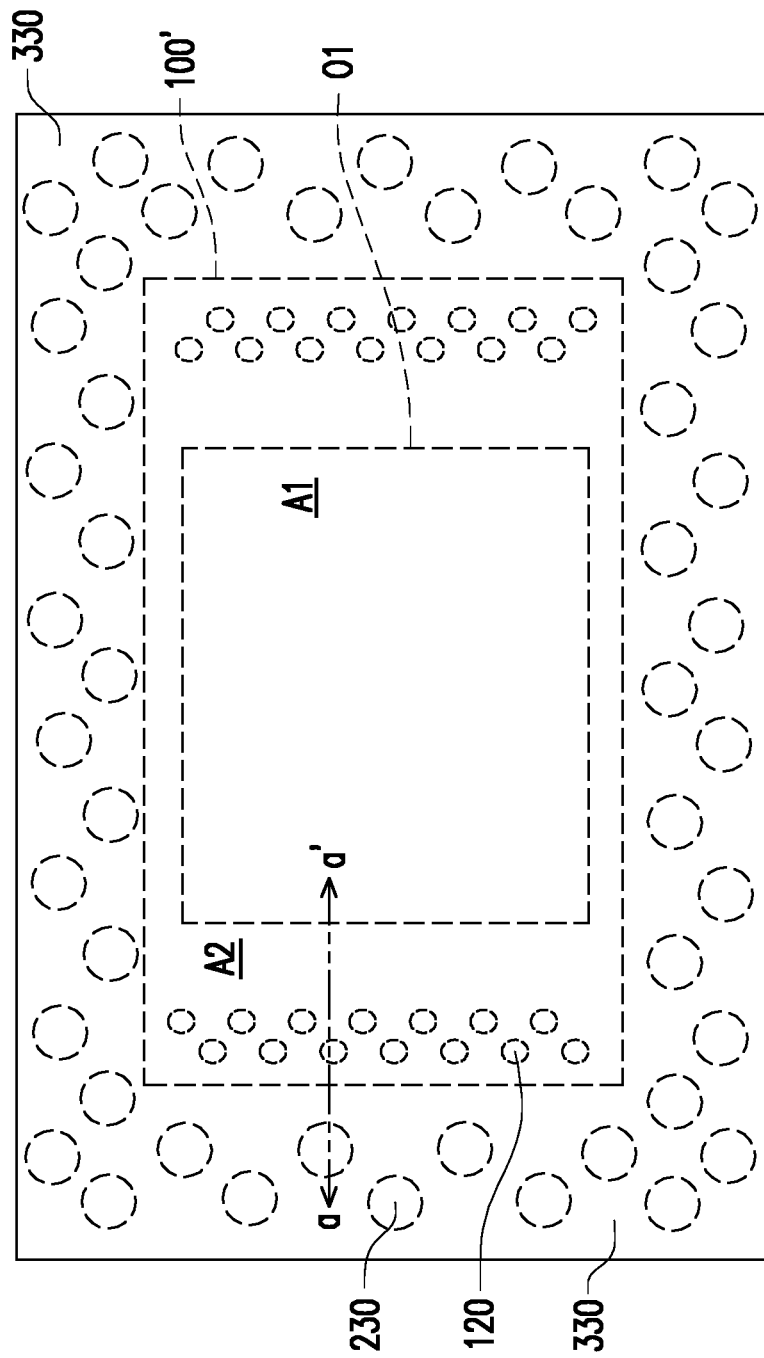
FIG. 2A is a schematic top view illustrating a package in accordance with some embodiments of the disclosure.
Figure 2B:
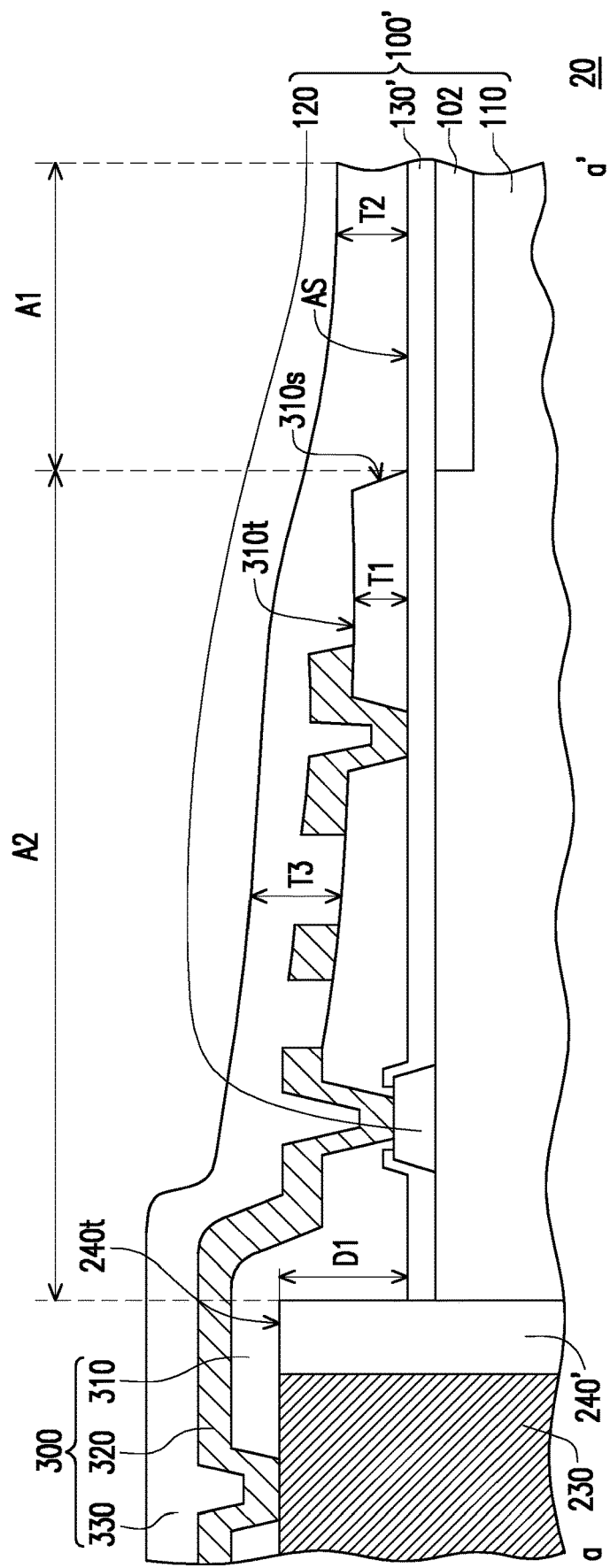
FIG. 2B is a schematic cross-sectional view illustrating a package in accordance with some embodiments of the disclosure.

FIG. 2A is a schematic top view illustrating a package 20 in accordance with some embodiments of the disclosure. FIG. 2B is a schematic cross-sectional view illustrating a package 20 in accordance with some embodiments of the disclosure.

Referring to FIG. 2A and FIG. 2B, the first insulation layer 310 is overlapping with the second area A2 and surrounding the first area A1. The redistribution layer 320 is disposed above the first insulation layer 310. The second insulation layer 330 is disposed above the redistribution layer 320 and overlapping with the second area A2 and the first area A1. The second insulation layer 330 covers a top surface 310t of the first insulation layer 310 and is in contact with a side surface 310s of the first insulation layer 310 and the top surface AS of the die 100'. The second insulation layer 330 is extending from the side surface 310s of the first insulation layer 310 to a top surface of the protection layer 130. The second insulation layer 330 covers and is in contact with a boundary between the side surface 310s of the first insulation layer 310 and the top surface AS of the die 100'.

In some embodiments, a top surface 240t of the encapsulant 240' is higher than the top surface AS of the die 100'. The vertical distance D1 between the top surface 240t and the top surface AS is in a range between 1 micrometer to 30 micrometer. In some embodiments, a thickness T1 of the first insulating layer 310 above the second area A2 is in a range between 2 micrometer to 30 micrometer. In some embodiments, a thickness T2 of the second insulation layer 330 above the first area A1 is in a range between 0.2 micrometer to 20 micrometer.

In some embodiments, a thickness T3 of the second insulation layer 330 above the second area A2 is in a range between 0.2 micrometer to 20 micrometer. In some embodiments, the second insulation layer 330 is non-conformally formed above the first insulating layer 310, the redistribution layer 320 and the die 100'. Therefore, the thickness T3 of the second insulation layer 330 above the second area A2 may be smaller than or equal to the thickness T2 of the second insulation layer 330 above the first area A1. In some embodiments, on the first area A1, the thickness of the second insulation layer 330 closed to a center of the first area A1 may be smaller than the thickness of the second insulation layer 330 closed to the side surface 310s of the first insulation layer 310. In some embodiments, a thickness of the redistribution layer 330 above the first area A1 is smaller than a thickness of the redistribution layer 330 above the second area A2.

In some embodiments, a material of the first insulating layer 310 and a material of the second insulation layer 330 include polyimide, epoxy resin, acrylic resin, benzocyclobutene (BCB), polybenzoxazole PBO, or any other suitable polymer-based dielectric material.

In some embodiments, a length of the first area A1 and a width of the first area A1 may in a range from 1 millimeters to 50 millimeters.

Base on the above, since the second insulation layer 330 is in contact with the side surface 310s of the first insulation layer 310 and the top surface AS of the die 100', the clean agent used in the clean process will not infiltrate into the interface between the first insulation layer 310 and the die 100', thereby a delamination problem of the first insulation layer 310 can be solved.

Figure 3A:
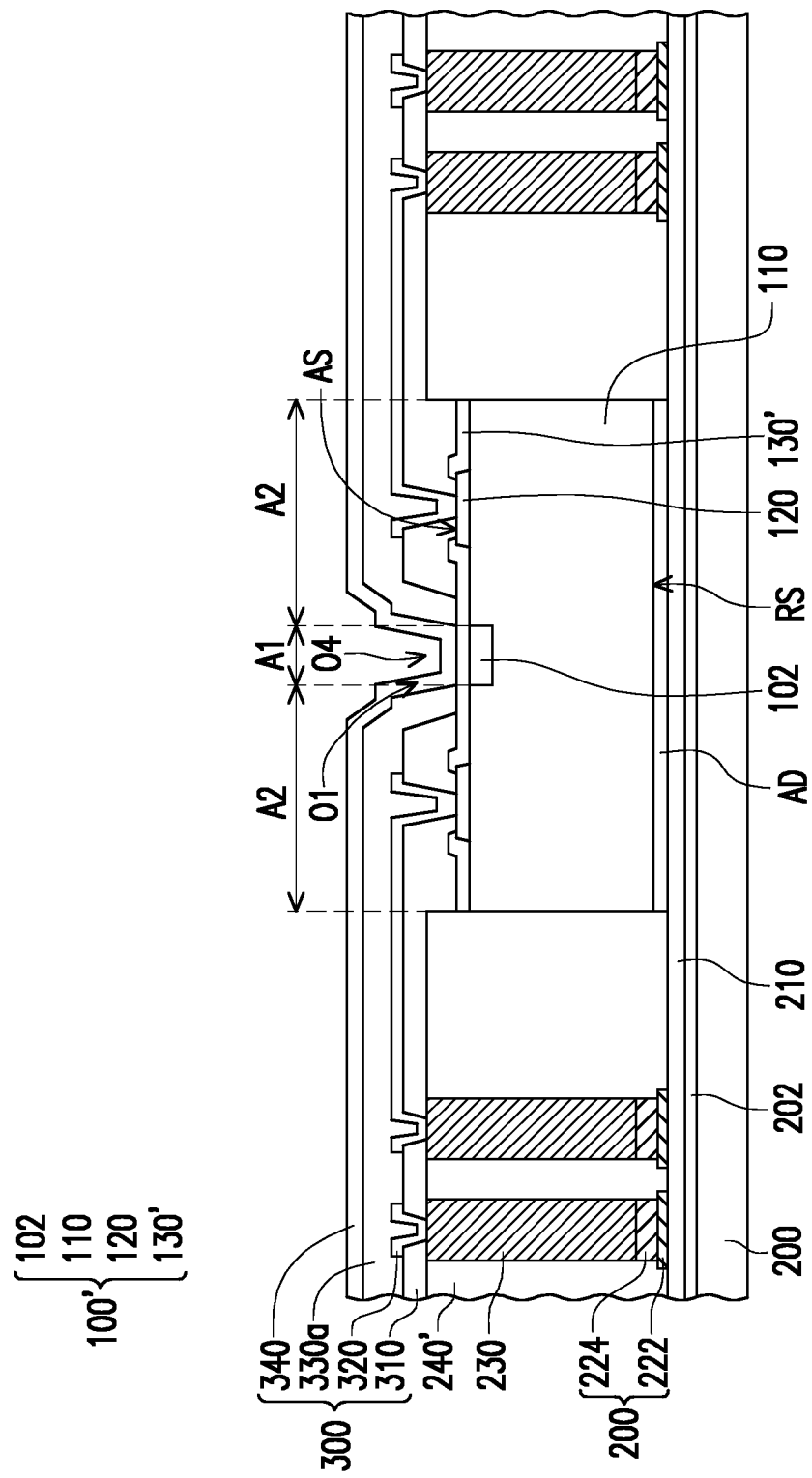
FIG. 3A through FIG. 3B are schematic cross-sectional views illustrating a fabrication method of a package in accordance with some embodiments of the disclosure.
Figure 3B:
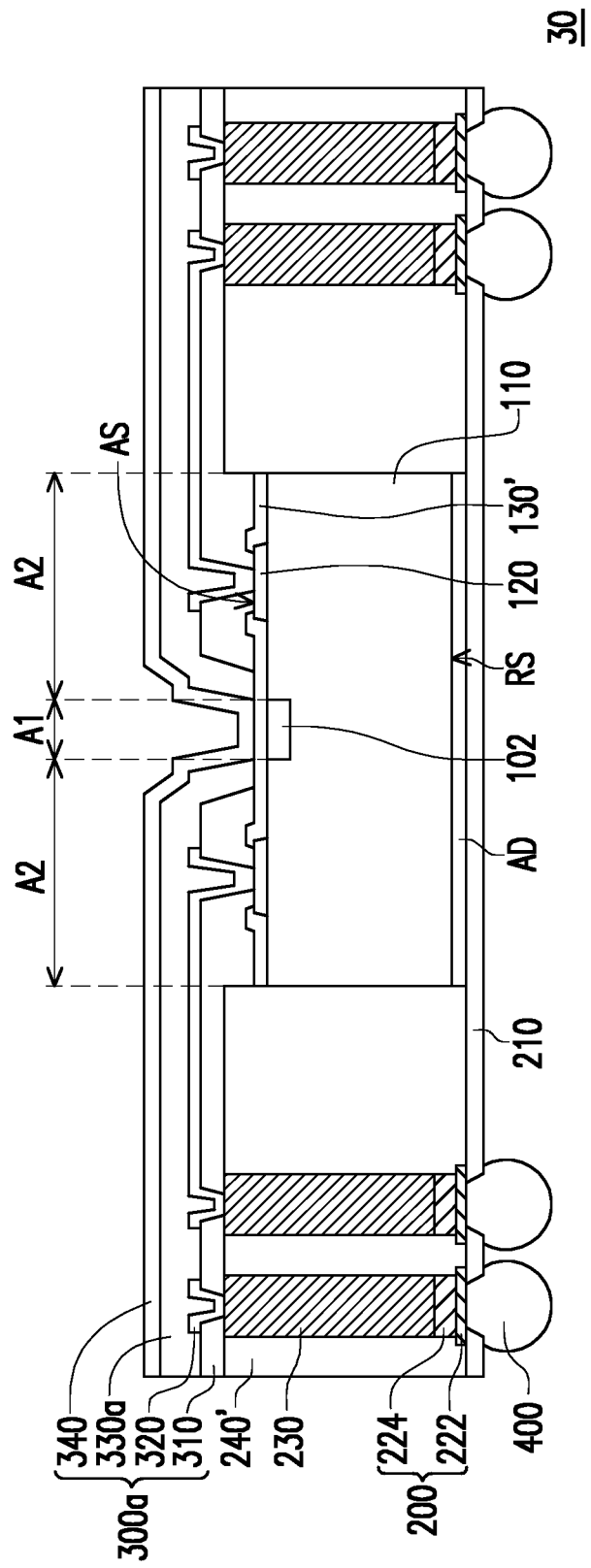

FIG. 3A through FIG. 3B are schematic cross-sectional views illustrating a fabrication method of a package 30 in accordance with some embodiments of the disclosure.

Referring to FIG. 3A, after forming the redistribution layer 320 described in FIG. 1J, a second insulation layer 340 and a third insulation layer 330a are formed over the redistribution layer 320 and the first insulating layer 310. The third insulation layer 330a is disposed between the first insulation layer 310 and the second insulation layer 340 and between the redistribution layer 320 and the second insulation layer 340.

In some embodiments, the third insulation layer 330a is overlapping with the second area A2 and is not overlapping with the first area A1.

In some embodiments, materials of the third insulation layer 330a and the second insulation layer 340 include polyimide, epoxy resin, acrylic resin, benzocyclobutene (BCB), polybenzoxazole PBO, or any other suitable polymer-based dielectric material. In some embodiments, the first insulating layer 310, the second insulation layer 340 and the third insulation layer 330a are made of the same or similar material.

In some embodiments, the third insulation layer 330a may be formed by the following steps. First, a dielectric material layer (not shown) is formed over the redistribution layer 320, the first insulating layer 310, and the top surface AS of the die 100' by suitable fabrication techniques such as spin-on coating, lamination, blade-coating, or the like. Subsequently, the dielectric material layer is patterned by a photolithography process and/or an etching process to form the third insulation layer 330a including a fourth openings O4. The first area A1 overlapping with the sensing component 102 is revealed by the first openings O1 of the first insulating layer 310 and the fourth openings O4 of the third insulation layer 330a thereby preventing the first insulating layer 310 and the third insulation layer 330a from causing negative impact on the sensing quality. In some embodiments, a size of the fourth openings O4 of the third insulation layer 330a is larger than a size of the first openings O1 of the first insulation layer 310. Therefore, a portion of the first insulation layer 310 is also exposed by the fourth openings O4 of the third insulation layer 330a.

In some embodiments, the second insulation layer 340 is overlapping with the second area A2 and the first area A1.

In some embodiments, the second insulation layer 340 may be formed over the third insulating layer 330a, the first insulating layer 310, and the top surface AS of the die 100' by suitable fabrication techniques such as spin-on coating, lamination, blade-coating, or the like. A top surface of the third insulating layer 330a, a side surface of the third insulating layer 330a near the first area A1, a top surface of the first insulating layer 310, a side surface of the first insulating layer 310 near the first area A1, and the protection layer 130' of the die 100' are covered by the second insulation layer 340.

The second insulation layer 340 is in contact with a side surface of the third insulation layer 330a and the top surface AS of the die 100' so as to protect the interface between the third insulation layer 330a and the die 100' from being damaged by a clean agent used in subsequent processes.

At this stage, a redistribution layer structure 300a including the first insulating layer 310, the redistribution layer 320, the second insulation layer 340, and the third insulation layer 330a is formed.

Referring to FIG. 3B, the dielectric layer 210 is de-bonded from the de-bonding layer 202 such that the dielectric layer 210 is separated from the carrier substrate 200. That is, the de-bonding layer 202 and the carrier substrate 200 are removed.

The dielectric layer 210 is patterned to form a plurality of contact openings partially exposing the redistribution structure 220. After the contact openings are formed in the dielectric layer 210, a plurality of conductive terminals 400 are formed in the contact openings such that the conductive terminals 400 are electrically connected to the TIVs 230 through the redistribution structure 220. After the conductive terminals 400 are formed, a singulation process is performed to form a plurality of packages 30. In some embodiments, the dicing process or the singulation process typically involves dicing with a rotating blade or a laser beam.

In some embodiments, the package 30 includes the dielectric layer 210, the TIVs 230, the encapsulant 240', the die 100', the redistribution layer structure 300a, and the conductive terminals 400. In some embodiments, the package 30 is an integrated fan-out (InFO) package that the redistribution layer structure 300a is laying over the encapsulant 240' and the die 100' molded by the encapsulant 240'.

In some embodiments, a clean process is performed on the package 30 to remove stains or byproducts generated in the manufacturing process of the package 30, for example, after forming the conductive terminals 400. Since the second insulation layer 340 is in contact with the side surface of the first insulation layer 310 and the top surface of the die 100', the clean agent used in the clean process cannot infiltrate into the interface between the first insulation layer 310 and the die 100', thereby a delamination problem of the first insulation layer 310 can be solved.

Figure 4A:
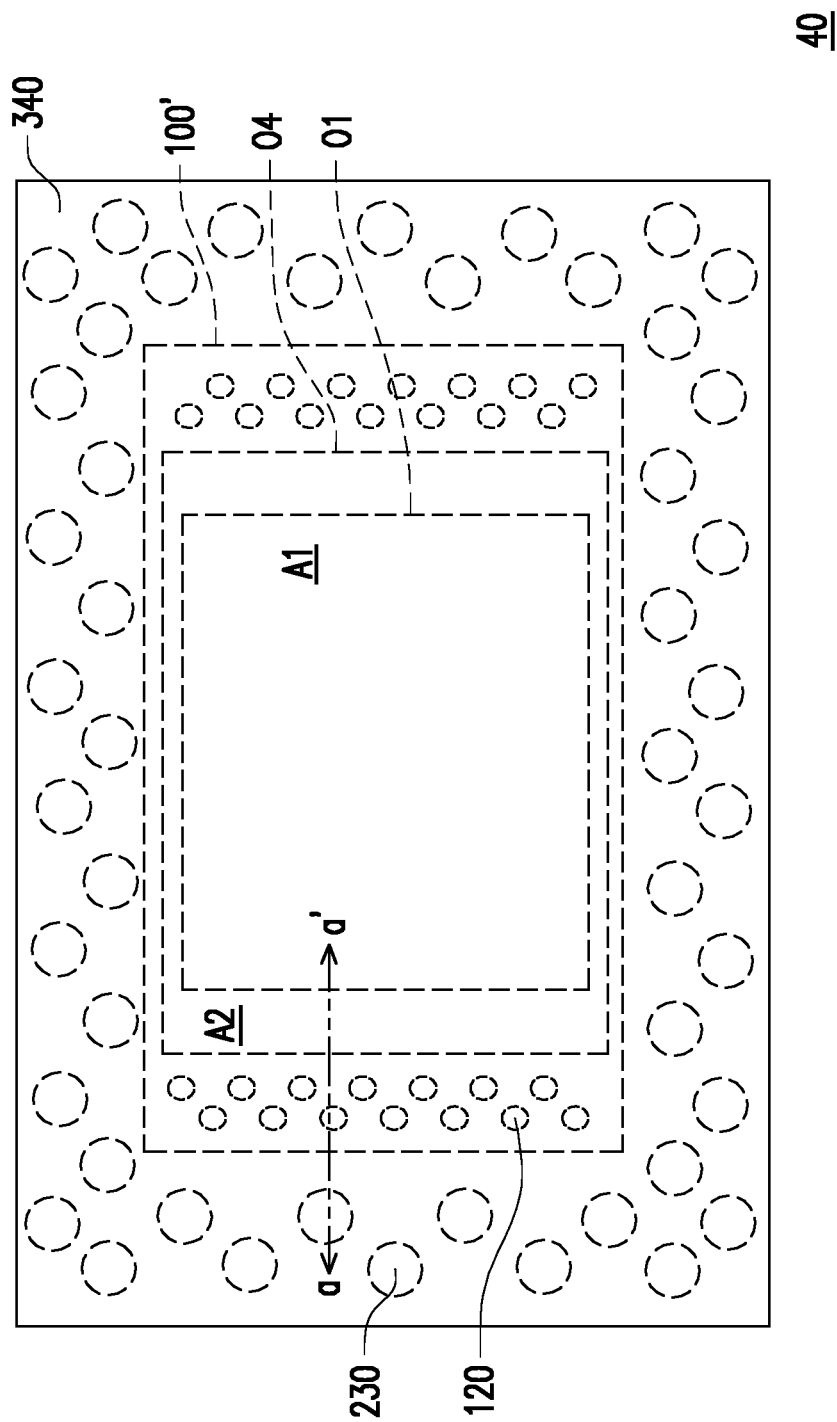
FIG. 4A is a schematic top view illustrating a package in accordance with some embodiments of the disclosure.
Figure 4B:
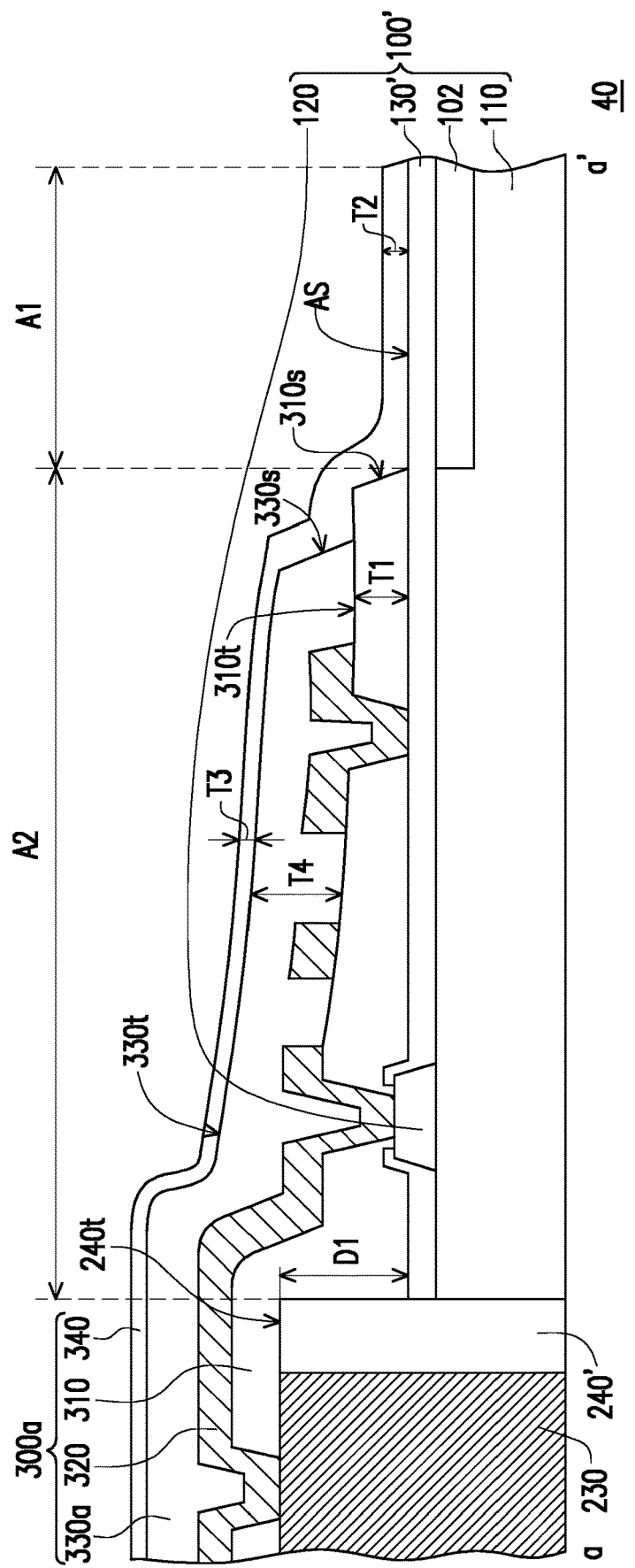
FIG. 4B is a schematic cross-sectional view illustrating a package in accordance with some embodiments of the disclosure.

FIG. 4A is a schematic top view illustrating a package 40 in accordance with some embodiments of the disclosure. FIG. 4B is a schematic cross-sectional view illustrating a package 40 in accordance with some embodiments of the disclosure.

Referring to FIG. 4A and FIG. 4B, the first insulation layer 310 and the third insulation layer 330a are overlapping with the second area A2 and surrounding the first area A1. The redistribution layer 320 is disposed above the first insulation layer 310. The second insulation layer 340 is disposed above the redistribution layer 320 and overlapping with the second area A2 and the first area A1. The third insulation layer 330a is disposed between the first insulation layer 310 and the second insulation layer 340 and between the redistribution layer 320 and the second insulation layer 340. The third insulation layer 330a covers the top surface 320t of the redistribution layer 320. A size of the fourth openings O4 of the third insulation layer 330a is larger than a size of the first openings O1 of the first insulating layer 310.

The second insulation layer 340 covers and is in contact with a top surface 330t of the third insulation layer 330a, a side surface 330s of the third insulation layer 330a, a top surface 310t of the first insulation layer 310, a side surface 310s of the first insulation layer 310 and the top surface AS of the die 100'. The second insulation layer 340 is extending from the side surface 310s of the first insulation layer 310 to a top surface of the protection layer 130. The second insulation layer 340 covers and is in contact with a boundary between the side surface 310s of the first insulation layer 310 and the top surface AS of the die 100'. The second insulation layer 340 covers and is in contact with a boundary between the side surface 330s of the third insulation layer 330 and the top surface 310t of the first insulation layer 310.

In some embodiments, a thickness T1 of the first insulating layer 310 above the second area A2 is in a range between 2 micrometer to 20 micrometer. In some embodiments, a thickness T2 of the second insulation layer 340 above the first area A1 is in a range between 0.2 micrometer to 10 micrometer. In some embodiments, the thickness T2 of the second insulation layer 340 above the first area A1 is smaller than or equal to a thickness T1 of the first insulation layer 310 above the second area A2.

In some embodiments, a thickness T4 of the third insulation layer 330a above the second area A2 is in a range between 2 micrometer to 30 micrometer. In some embodiments, a thickness T3 of the second insulation layer 340 above the second area A2 is in a range between 0.2 micrometer to 20 micrometer. In some embodiments, the second insulation layer 340 is non-conformally formed above the first insulating layer 310, the third insulation layer 330a and the die 100'. Therefore, the thickness T3 of the second insulation layer 340 above the second area A2 may be smaller than the thickness T2 of the second insulation layer 340 above the first area A1. In some embodiments, on the first area A1, a thickness of the second insulation layer 340 closed to a center of the first area A1 may be smaller than a thickness of the second insulation layer 340 closed to the side surface 310s of the first insulation layer 310.

In some embodiments, a material of the first insulating layer 310, a material of the second insulation layer 340, and a material of the third insulation layer 330a include polyimide, epoxy resin, acrylic resin, benzocyclobutene (BCB), polybenzoxazole PBO, or any other suitable polymer-based dielectric material.

Base on the above, a thickness of the redistribution layer 300a above the first area A1 is smaller than a thickness of the redistribution layer 300a above the second area A2. Therefore, the negative impact of the redistribution layer 300a on the sensing quality of package 40 can be reduced.

Figure 5:
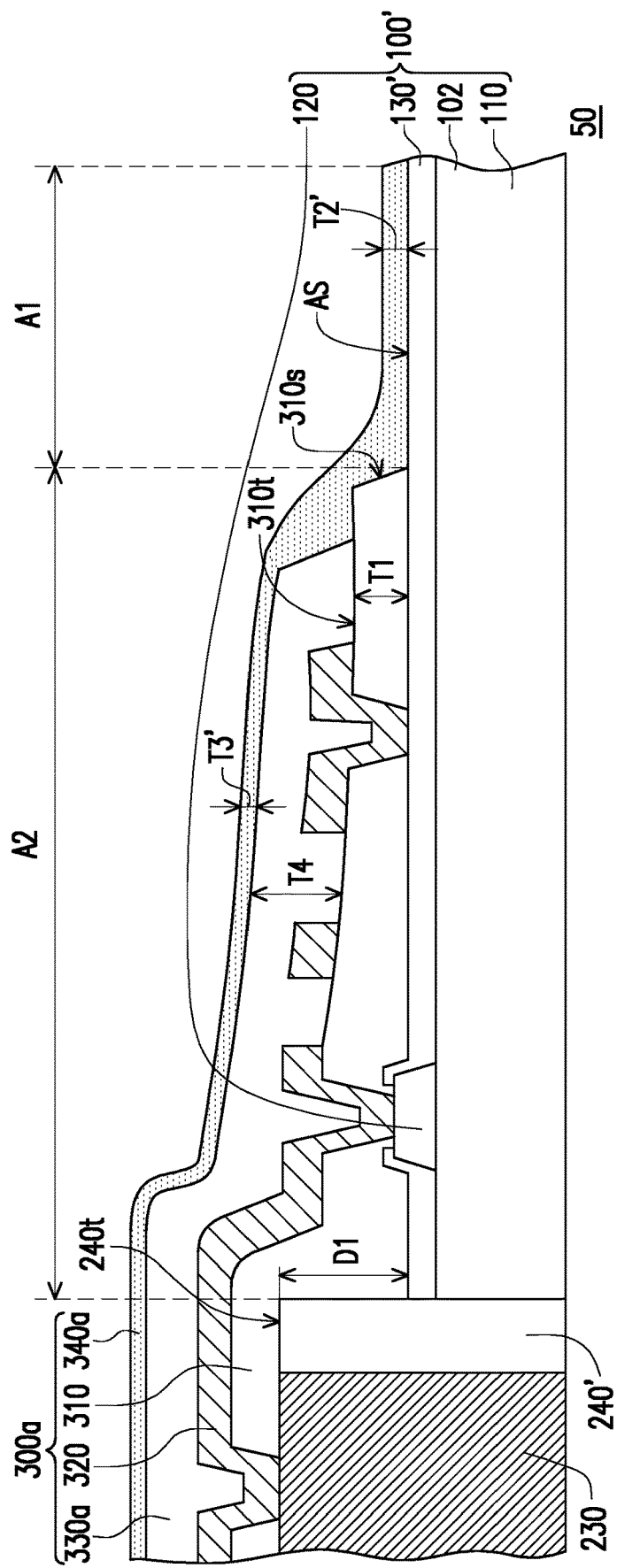
FIG. 5 is a schematic top view illustrating a package in accordance with some embodiments of the disclosure.

FIG. 5 is a schematic cross-sectional view illustrating a package 50 in accordance with some embodiments of the disclosure. It should be mentioned here that, the embodiment of FIG. 5 adopts the reference numerals of the embodiment of FIG. 4A and FIG. 4B and a portion of the content thereof, wherein the same or similar numerals are used to represent the same or similar devices and descriptions of the same technical content are omitted. The omitted portions are as described in the above embodiments and are not repeated herein. For ease of explanation, FIG. 5 omit some components of the device substrate.

The main difference between a package 50 of FIG. 5 and the package 40 of FIG. 4B is that a second insulation layer 340a of the package 50 includes a material different from a material of the second insulation layer 340 of the package 40.

Referring to FIG. 5, the material of the second insulation layer 340a is different from a material of the first insulation layer 310. In some embodiments, the first insulation layer 310 and the third insulation layer 330a are made of polyimide, epoxy, acrylic resin, benzocyclobutene, or polybenzoxazole. In some embodiments, the materials of second insulation layer 340a and the protection layer 130 of the dies 100' include silicon nitride, silicon oxide, or other ceramic compounds, or a combination thereof. In some embodiments, a cohesion between the second insulation layer 340a and the top surface AS of the die 100' is stronger than a cohesion between the first insulation layer 310 and the top surface AS of the die 100' since both of the second insulation layer 340a and the protection layer 130 are insulation layers including silicon element. That is, the cohesion between the second insulation layer 340a and the protection layer 130 is stronger than the cohesion between the first insulation layer 310 (or the third insulation layer 330a) and the protection layer 130.

In some embodiments, the second insulation layer 340a may be formed by sol-gel process or the like. In some embodiments, a thickness T2' of the second insulation layer 340a above the first area A1 is in a range between 0.1 micrometer to 15 micrometer. In some embodiments, the thickness T2' of the second insulation layer 340a above the first area A1 is smaller than a thickness T1 of the first insulation layer 310 above the second area A2. In some embodiments, a thickness T3' of the second insulation layer 340a above the second area A2 is in a range between 0.1 micrometer to 15 micrometer.

In some embodiments, a clean process is performed on the package 50 to remove stains or byproducts generated in the manufacturing process of the package 50. Since the cohesion between the second insulation layer 340a and the top surface AS of the die 100' is stronger than the cohesion between the first insulation layer 310 and the top surface AS of the die 100', the clean agent used in the clean process cannot infiltrate into the interface between the first insulation layer 310 and the die 100', thereby a delamination problem of the first insulation layer 310 can be solved.

Figure 6:
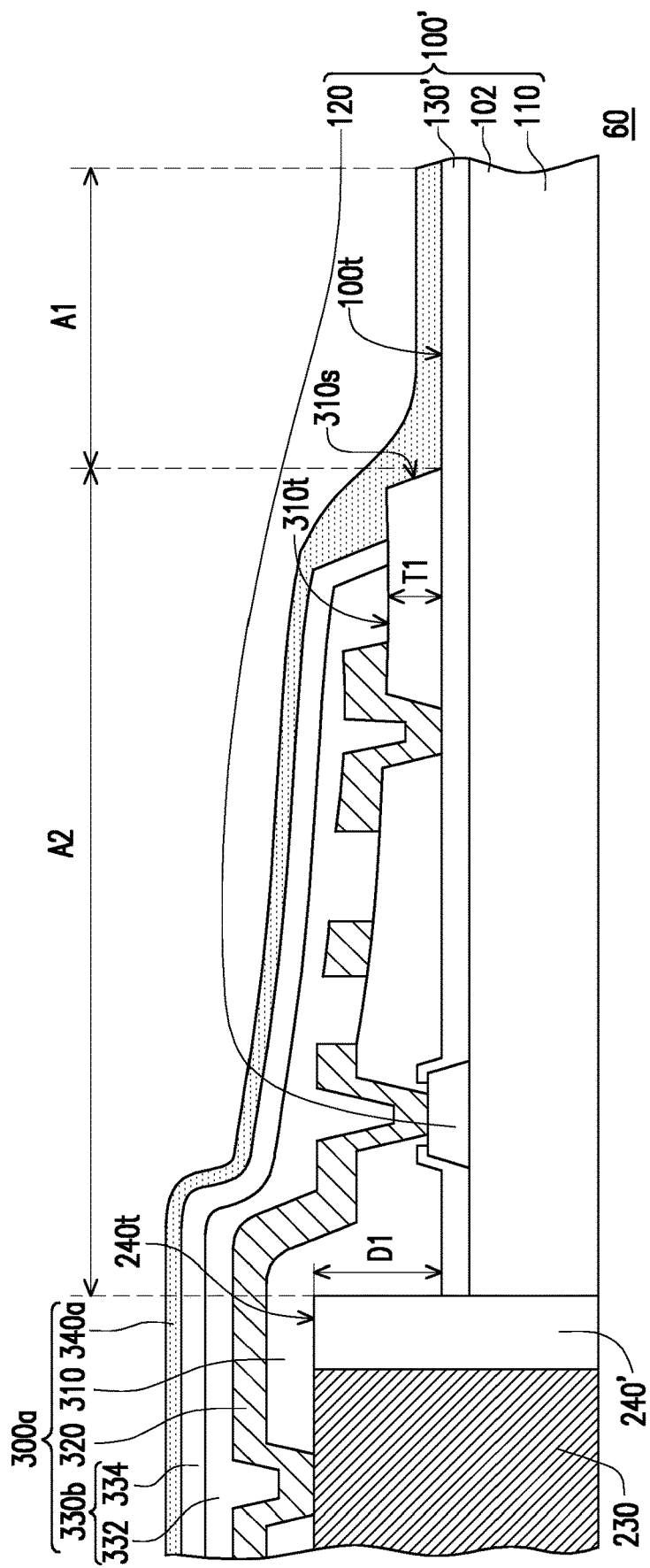
FIG. 6 is a schematic top view illustrating a package in accordance with some embodiments of the disclosure.

FIG. 6 is a schematic cross-sectional view illustrating a package 60 in accordance with some embodiments of the disclosure. It should be mentioned here that, the embodiment of FIG. 6 adopts the reference numerals of the embodiment of FIG. 5 and a portion of the content thereof, wherein the same or similar numerals are used to represent the same or similar devices and descriptions of the same technical content are omitted. The omitted portions are as described in the above embodiments and are not repeated herein. For ease of explanation, FIG. 6 omit some components of the device substrate.

The main difference between a package 60 of FIG. 6 and the package 50 of FIG. 5 is that a third insulation layer 330b of the package 60 has a multi-layer structure comprising a first layer 332 and a second layer 334. In some embodiments, one of the first layer 332 and the second layer 334 is a silicon nitride layer, and another one of the first layer 332 and the second layer 334 is a silicon oxide layer.

In some embodiments, since both of the second insulation layer 340a and the third insulation layer 330b are insulation layers including silicon element, a cohesion between the second insulation layer 340a and the third insulation layer 330b can be improved.

FIG. 7A through FIG. 7C are schematic cross-sectional views illustrating a fabrication method of a second insulation layer 330c of a package 70 in accordance with some embodiments of the disclosure.

Referring to FIG. 7A, a dielectric material layer DL is formed over the first insulation layer 310, the redistribution layer 320 and the die 100' by suitable fabrication techniques such as spin-on coating or the like. In some embodiments, a material of the dielectric material layer DL includes a photoresist, epoxy, PBO, polyimide, or other suitable materials.

A soft bake process is performed on the dielectric material layer DL to remove solvents in the dielectric material layer DL. In some embodiments, the soft bake process is performed on hot plates or in exhausted ovens and temperatures range from 70 degrees Celsius to 160 degrees Celsius. After the soft bake process, an additional bake process is performed on the dielectric material layer DL to cause a partially cross-linking of the dielectric material layer DL. In some embodiments, the additional bake process is performed on hot plates or in exhausted ovens and temperatures range from 70 degrees Celsius to 200 degrees Celsius.

Referring to FIG. 7B and FIG. 7C, a photomask MK is provided on the dielectric material layer DL. In some embodiments, the first area A1 is shielded by the photomask MK and the second area A2 is exposed by the photomask MK. In some embodiments, a portion of the second area A2 is also shielded by the photomask MK.

An exposure process is performed on the dielectric material layer DL to cause a cross-linking of the dielectric material layer DL exposed by the photomask MK.

After the exposure process, the photomask MK is removed. A development process is performed on the dielectric material layer DL to form the second insulation layer 330b.

Figure 8:
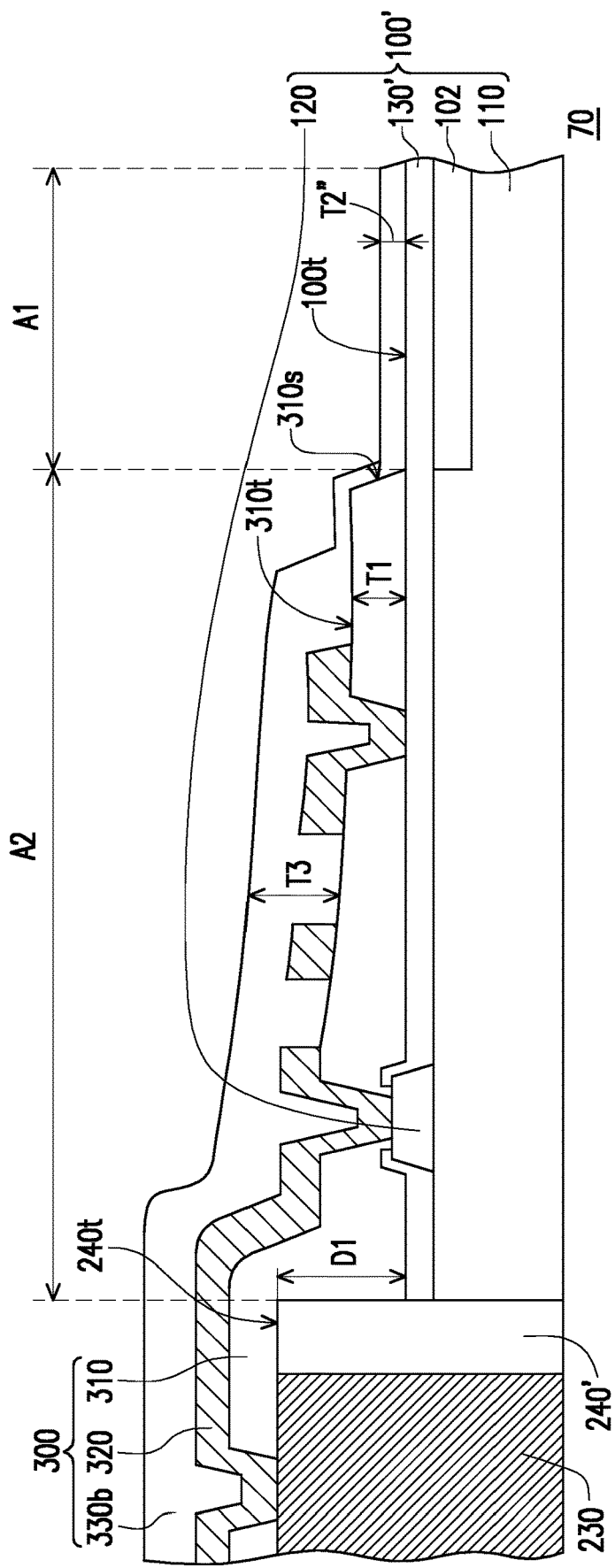
FIG. 8 is a schematic cross-sectional view illustrating a package in accordance with some embodiments of the disclosure.

FIG. 8 is a schematic cross-sectional view illustrating the package 70 in accordance with some embodiments of the disclosure. It should be mentioned here that, the embodiment of FIG. 8 adopts the reference numerals of the embodiment of FIG. 2B and a portion of the content thereof, wherein the same or similar numerals are used to represent the same or similar devices and descriptions of the same technical content are omitted. The omitted portions are as described in the above embodiments and are not repeated herein. For ease of explanation, FIG. 8 omit some components of the device substrate.

The main difference between a package 70 of FIG. 8 and the package 20 of FIG. 2B is that a thickness T2" of the second insulation layer 330b of the package 70 above the first area A1 has been reduced by the photolithography process described in FIG. 7A through FIG. 7C.

Referring to FIG. 8, the thickness T2" of the second insulation layer 330b above the first area A1 is smaller than a thickness T1 of the first insulation layer 310 above the second area A2. In some embodiments, a thickness T2" of the second insulation layer 330b above the first area A1 is in a range between 0.5 micrometer to 10 micrometer.

Base on the above, a thickness T2" of the second insulation layer 330b above the first area A1 has been reduced by the photolithography process described in FIG. 7A through FIG. 7C. Therefore, the negative impact of the redistribution layer on the sensing quality of package 70 can be reduced.

Figure 9A:
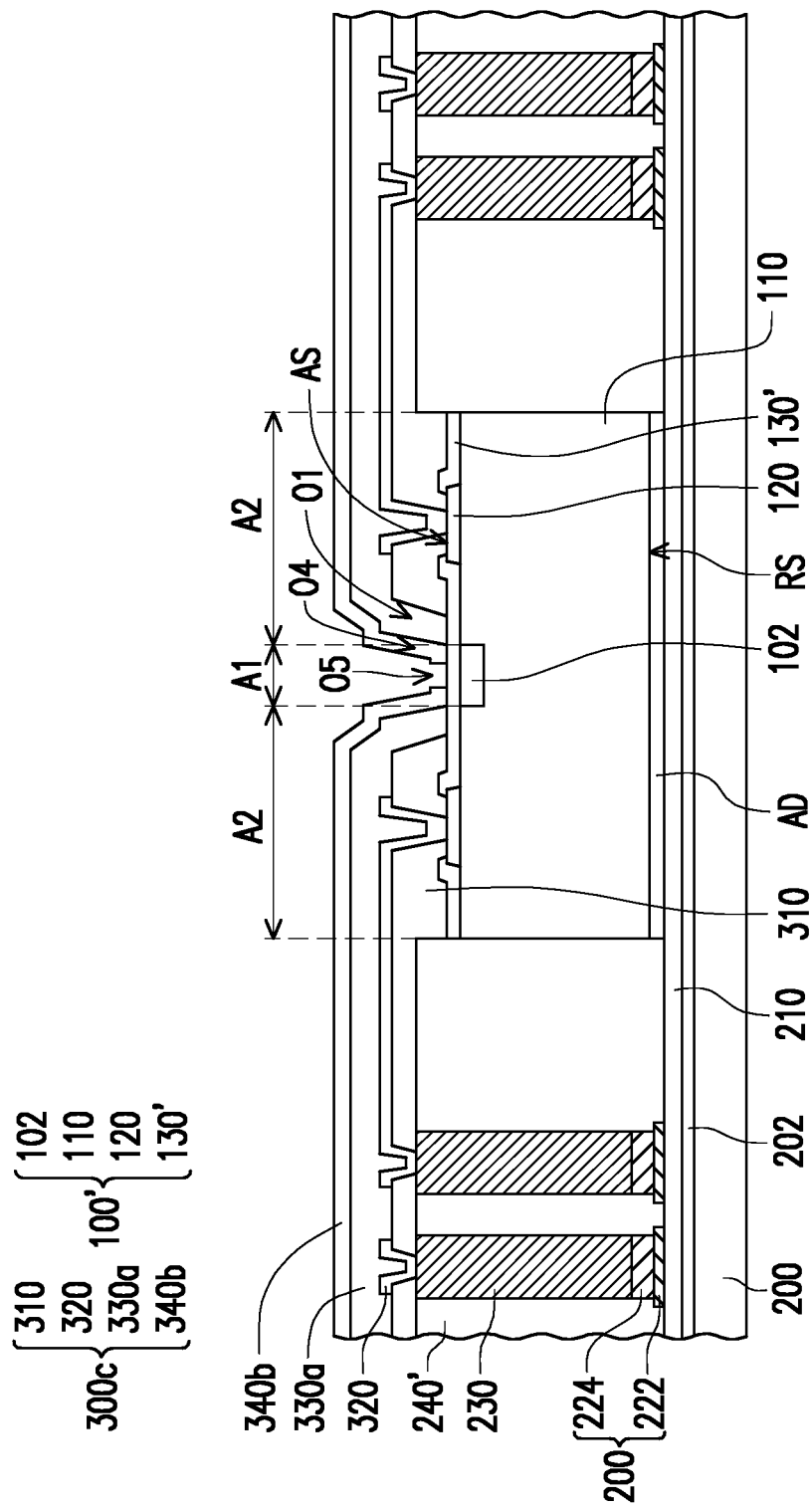
FIG. 9A through FIG. 9B are schematic cross-sectional views illustrating a fabrication method of a package in accordance with some embodiments of the disclosure.
Figure 9B:
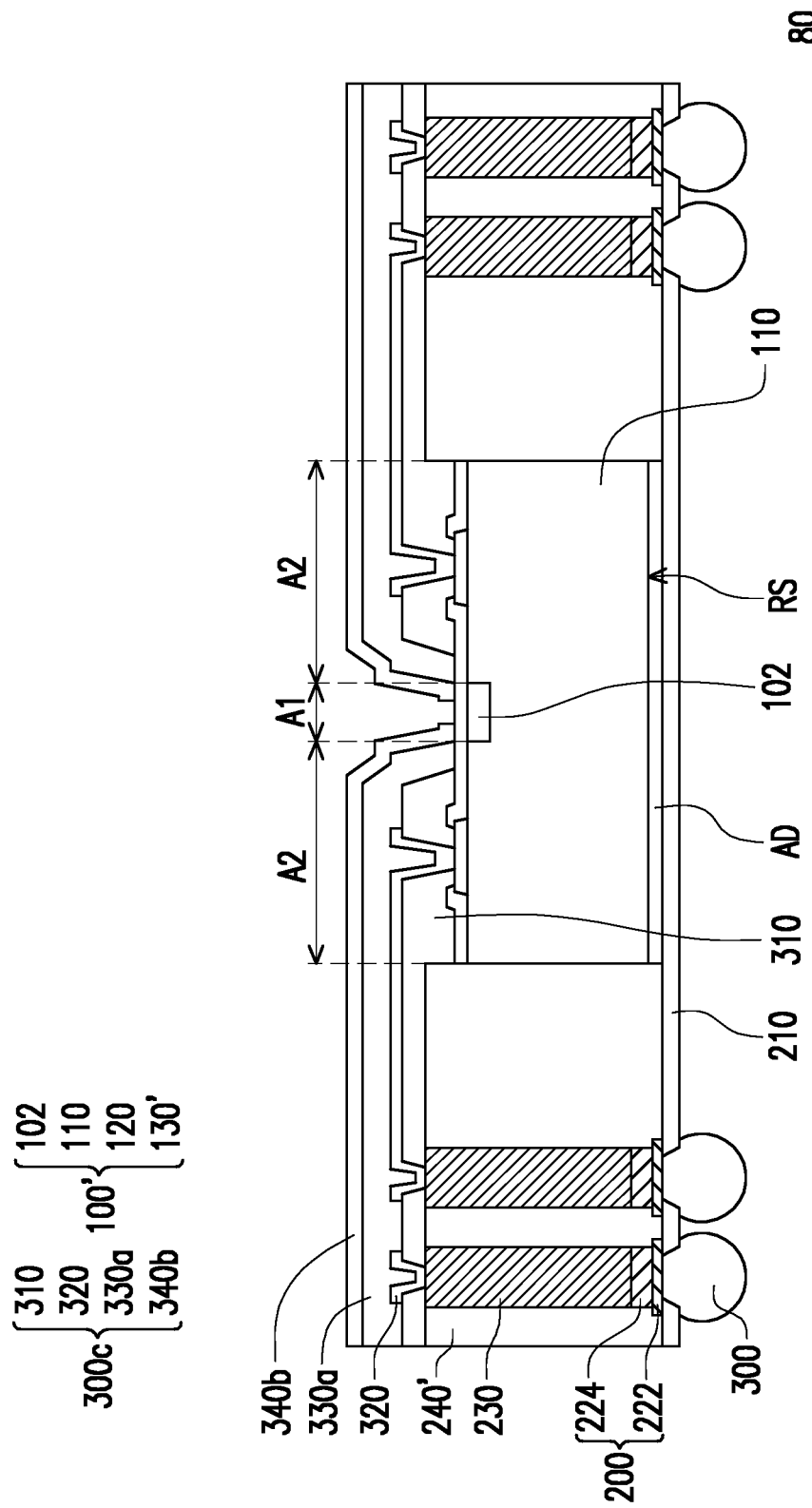

FIG. 9A through FIG. 9B are schematic cross-sectional views illustrating a fabrication method of a package 80 in accordance with some embodiments of the disclosure. It should be mentioned here that, the embodiment of FIG. 9A and FIG. 9B adopts the reference numerals of the embodiment of FIG. 5 and a portion of the content thereof, wherein the same or similar numerals are used to represent the same or similar devices and descriptions of the same technical content are omitted. The omitted portions are as described in the above embodiments and are not repeated herein. For ease of explanation, FIG. 5 omit some components of the device substrate.

The main difference between a package 80 of FIG. 9B and the package 50 of FIG. 5 is that the die 100' of the package 80 is exposed by a second insulation layer 340b of the package 80.

Referring to FIG. 9A, after forming the redistribution layer 320 described in FIG. 1J, a second insulation layer 340b and a third insulation layer 330a are formed over the redistribution layer 320 and the first insulating layer 310. The third insulation layer 330a is disposed between the first insulation layer 310 and the second insulation layer 340b and between the redistribution layer 320 and the second insulation layer 340b.

In some embodiments, the second insulation layer 340b is overlapping with the second area A2 and having an opening O5 exposing the first area A1 of the top surface AS of the die 100'. In some embodiments, a size of the opening O5 is smaller than a size of the first opening O1 of the first insulation layer 310 and a size of the fourth openings O4 of the third insulation layer 330a. Therefore, a portion of the second insulation layer 340b covers and is in contact with a boundary between a side surface of the third insulation layer 330a and the top surface AS of the die 100'.

In some embodiment, the second insulation layer 340b is made of silicon oxide, silicon nitride or the combination thereof. During the formation of the second insulation layer 340b, a patterning process is performed to define the opening O5. In some process, the second insulation layer 340b is fabricated by a photosensitive sol-gel method. However, the disclosure is not limited thereto.

In some embodiments, the second insulation layer 340b may be formed over the third insulating layer 330a, the first insulating layer 310, and the top surface AS of the die 100' by sol-gel process or the like. A top surface of the third insulating layer 330a, a side surface of the third insulating layer 330a near the first area A1, a top surface of the first insulating layer 310, a side surface of the first insulating layer 310 near the first area A1, and the protection layer 130' of the die 100' are covered by the second insulation layer 340b. In some embodiments, the second insulation layer 340b is patterned to form the opening O5 by photolithography and/or etching process.

At this stage, a redistribution layer structure 300c including the first insulating layer 310, the redistribution layer 320, the second insulation layer 340b, and the third insulation layer 330a is formed.

Referring to FIG. 9B, the dielectric layer 210 is de-bonded from the de-bonding layer 202 such that the dielectric layer 210 is separated from the carrier substrate 200. That is, the de-bonding layer 202 and the carrier substrate 200 are removed. a plurality of conductive terminals 400 are formed in contact openings of the dielectric layer 210. After the conductive terminals 400 are formed, a singulation process is performed to form a plurality of packages 80.

In some embodiments, a clean process is performed on the package 80 to remove stains or byproducts generated in the manufacturing process of the package 80, for example, after forming the conductive terminals 400. Since the second insulation layer 340b is in contact with the side surface of the first insulation layer 310 and the top surface of the die 100', the clean agent used in the clean process cannot infiltrate into the interface between the first insulation layer 310 and the die 100', thereby a delamination problem of the first insulation layer 310 can be solved.

Figure 10A:
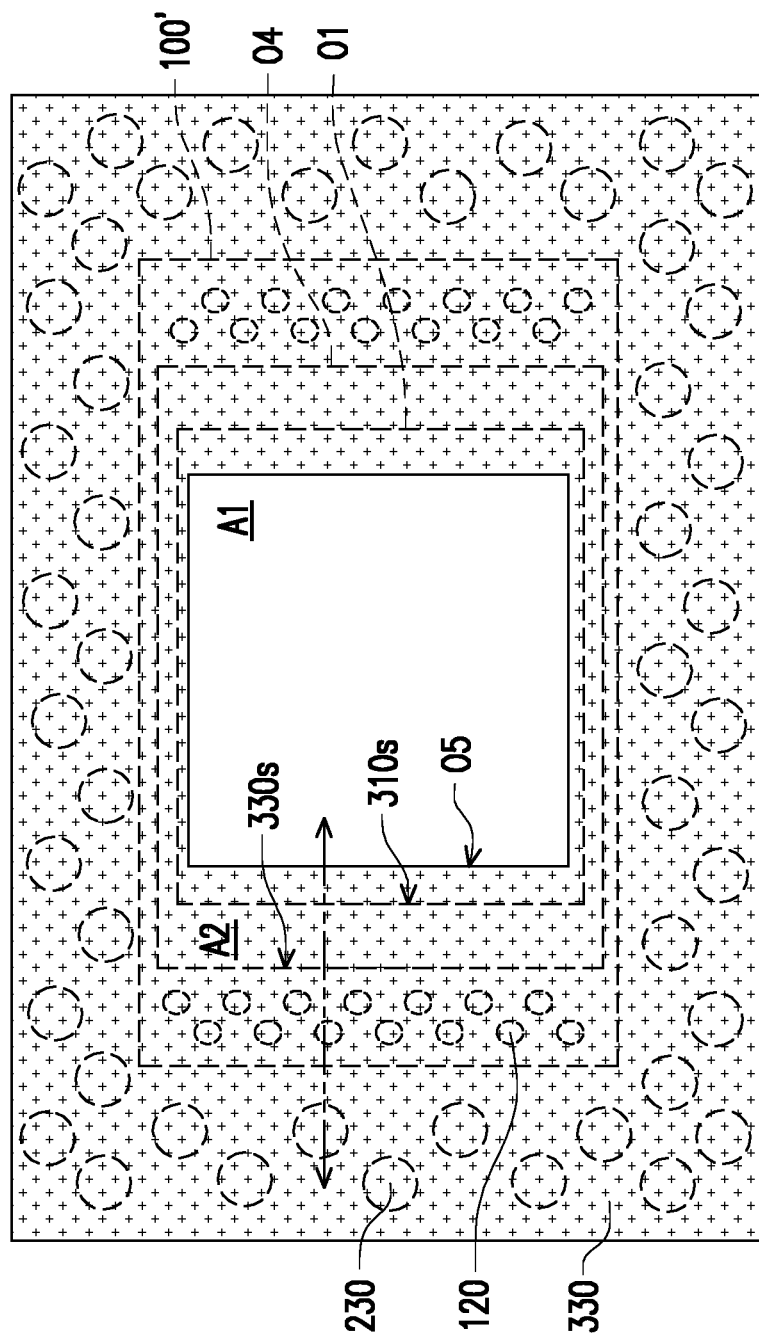
FIG. 10A is a schematic top view illustrating a package in accordance with some embodiments of the disclosure.
Figure 10B:
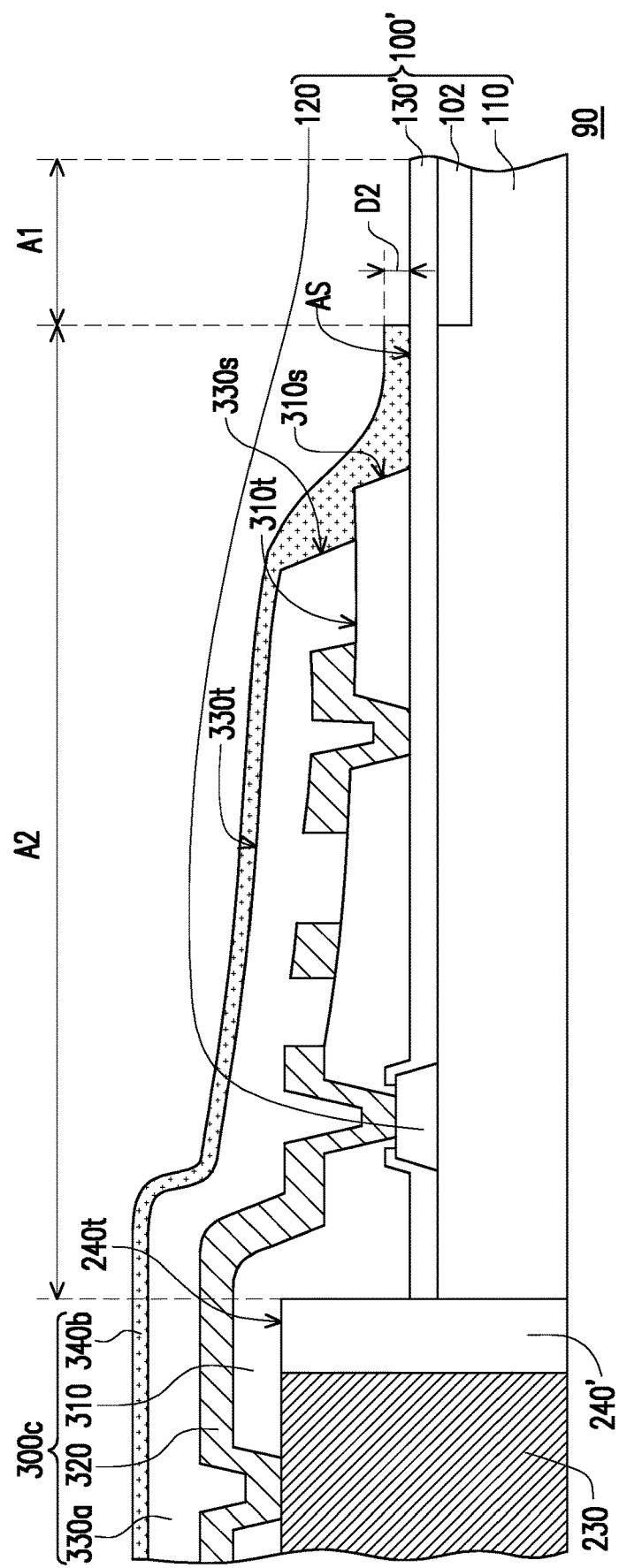
FIG. 10B is a schematic cross-sectional view illustrating a package in accordance with some embodiments of the disclosure.

FIG. 10A is a schematic top view illustrating a package 90 in accordance with some embodiments of the disclosure. FIG. 10B is a schematic cross-sectional view illustrating a package 90 in accordance with some embodiments of the disclosure.

Referring to FIG. 10A and FIG. 10B, the package 90 includes the TIVs 230, the encapsulant 240', the die 100', and the redistribution layer structure 300c. The redistribution layer structure 300c includes a first insulating layer 310, a redistribution layer 320, a third insulating layer 330a, and a second insulation layer 340b.

The second insulation layer 340b is formed over a top surface 330t of the third insulating layer 330a, a side surface 330s of the third insulating layer 330a, a top surface 310t of the first insulating layer 310, a side surface 310s of the first insulating layer 310, and the top surface AS of the die 100'. The first area A1 of the top surface AS of the die 100' is overlapping with an opening O5 of the second insulation layer 340b. In some embodiments, a depth D2 of the opening O5 is in a range between 0.2 micrometer to 10 micrometer.

In some embodiments, the material of the second insulation layer 340b is different from a material of the first insulation layer 310. In some embodiments, the material of the first insulation layer 310 includes polyimide, epoxy, acrylic resin, benzocyclobutene, or polybenzoxazole. In some embodiments, the material of second insulation layer 340b and the protection layer 130 of the dies 100' include silicon nitride, silicon oxide, or a combination thereof. In some embodiments, a cohesion between the second insulation layer 340b and the top surface AS of the die 100' is stronger than a cohesion between the first insulation layer 310 and the top surface AS of the die 100' since both of the second insulation layer 340b and the protection layer 130 are insulation layers including silicon element. That is, the cohesion between the second insulation layer 340b and the protection layer 130 is stronger than the cohesion between the first insulation layer 310 and the protection layer 130.

In some embodiments, a clean process is performed on the package 40 to remove stains or byproducts generated in the manufacturing process of the package 40. Since the cohesion between the second insulation layer 340b and the top surface AS of the die 100' is stronger than the cohesion between the first insulation layer 310 and the top surface AS of the die 100', the clean agent used in the clean process cannot infiltrate into the interface between the first insulation layer 310 and the die 100', thereby a delamination problem of the first insulation layer 310 can be solved.

Figure 11:
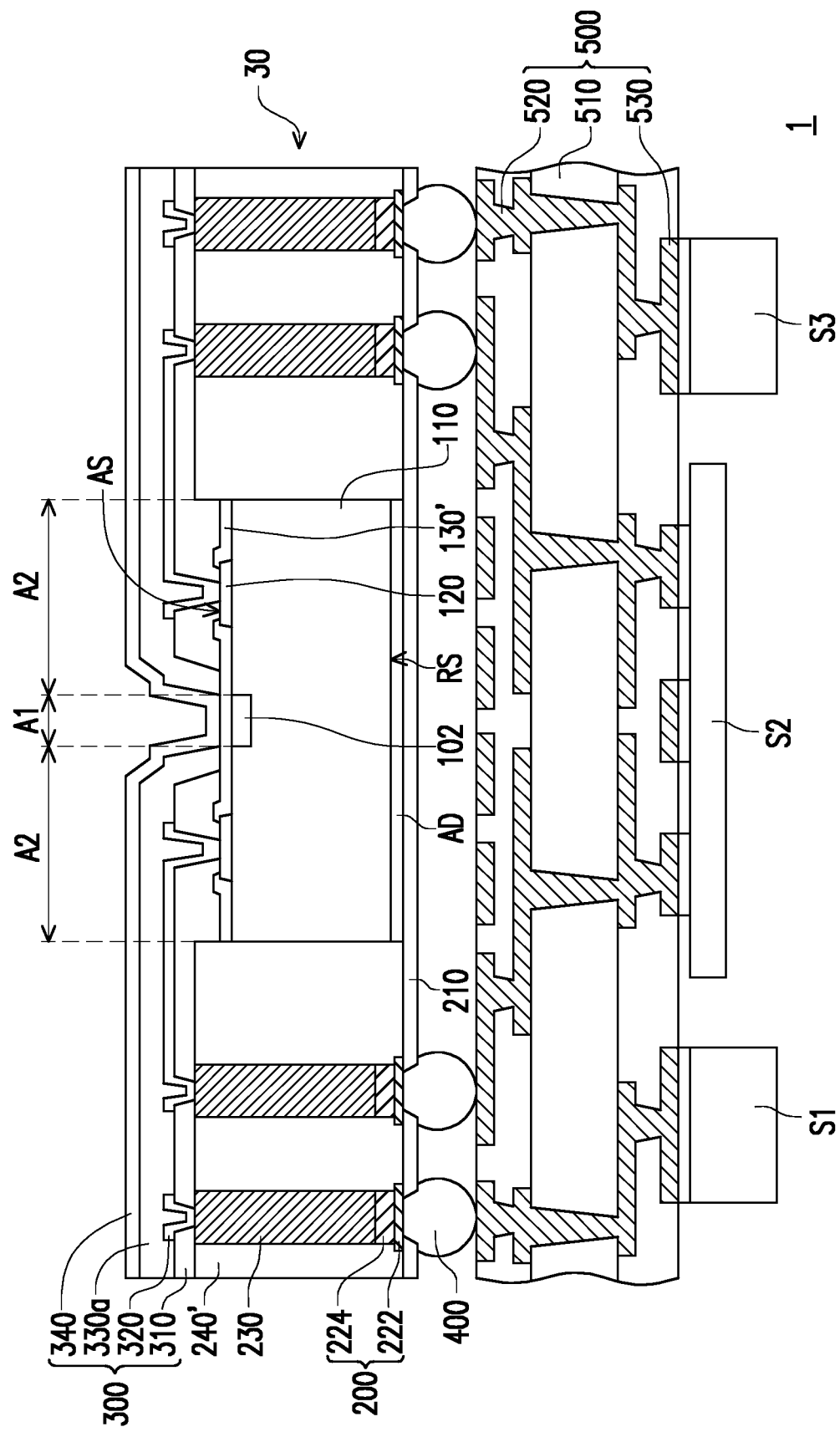
FIG. 11 is a schematic cross-sectional view illustrating an electronic device in accordance with some embodiments of the disclosure.

FIG. 11 is a schematic cross-sectional view illustrating an electronic device 1 in accordance with some embodiments of the disclosure.

Referring to FIG. 11, the electronic device 1 includes a circuit substrate 500, and one or more package. In FIG. 11, the package 30 described in the embodiment of FIG. 3B is used to illustrated a structure of the device 1. However, the disclosure is not limited thereto. The electronic device 1 may include other packages described in other embodiments.

Referring to FIG. 11, the package 30 is disposed over the circuit substrate 500. The circuit substrate 500 includes a substrate 510, a first redistribution structure 520 disposed over a front side of the substrate 510, and a second redistribution structure 530 disposed over a back side of the substrate 510. The conductive terminals 400 of the package 30 is electrically connected with the first redistribution structure 520, and the first redistribution structure 520 is electrically connected with the second redistribution structure 530 through vias of the substrate 510. Signal sources S1, S2 and S3 are electrically connected with the second redistribution structure 530.

In some embodiments, the present application provides a package comprising a die and a redistribution layer. A top surface of the die has a first area and a second area connected with the first area. The redistribution layer structure comprises a first insulation layer, a redistribution layer, and a second insulation layer. The first insulation layer is overlapping with the second area. The redistribution layer is disposed above the die. The second insulation layer is disposed above the redistribution layer and overlapping with the second area and the first area. The second insulation layer covers a top surface of the first insulation layer and is in contact with a side surface of the first insulation layer and the top surface of the die.

In some embodiments, the present application provides a package comprising a die and a redistribution layer. A top surface of the die has a first area and a second area connected with the first area. The redistribution layer structure comprises a first insulation layer, a second insulation layer, and a redistribution layer. The first insulation layer is overlapping with the second area. The second insulation layer is disposed above the first insulation layer and the die. The second insulation layer covers and is in contact with a boundary between a side surface of the first insulation layer and the top surface of the die. A cohesion between the second insulation layer and the top surface of the die is stronger than a cohesion between the first insulation layer and the top surface of the die. The redistribution layer is disposed above the die.

In some embodiments, the present application provides a package comprising a die and a redistribution layer structure. A top surface of the die has a first area and a second area surrounding the first area. The redistribution layer structure comprises a first insulation layer, a redistribution layer, a second insulation layer, and a third insulation layer. The first insulation layer is disposed above the second area and surrounding the first area. The redistribution layer is disposed above the first insulation layer. The second insulation layer is disposed above the redistribution layer and is overlapping with the second area. The second insulation layer covers and is in contact with a boundary between a side surface of the first insulation layer and the top surface of the die. The third insulation layer is disposed between the first insulation layer and the second insulation layer and between the redistribution layer and the second insulation layer. The second insulation layer covers and is in contact with a boundary between a side surface of the third insulation layer and a top surface of the first insulation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
 a die, wherein a top surface of the die has a first area and a second area connected with the first area; and
 a redistribution layer structure comprising:
  a first insulation layer overlapping with the second area;
  a redistribution layer disposing above the die; and
  a second insulation layer disposing above the redistribution layer and overlapping with the second area and the first area, wherein the second insulation layer covers a top surface of the first insulation layer and is in contact with a side surface of the first insulation layer and the top surface of the die.

2. The package according to claim 1, wherein a material of the first insulation layer comprises polyimide, epoxy, acrylic resin, benzocyclobutene or polybenzoxazole.

3. The package according to claim 1, wherein a material of the second insulation layer comprises polyimide, epoxy, acrylic resin, benzocyclobutene, polybenzoxazole, silicon nitride or silicon oxide.

4. The package according to claim 1, wherein the die comprises:
 a semiconductor substrate;
 a sensing component, disposed on the semiconductor substrate or embedded in the semiconductor substrate, wherein the first area is a sensing area overlapped with the sensing component, and the second area is a non-sensing area;
 a protection layer disposing above the semiconductor substrate, wherein the second insulation layer is extending from the side surface of the first insulation layer to a top surface of the protection layer; and
 conductive pads disposing on the semiconductor substrate, wherein the redistribution layer is electrically connected with the conductive pads through vias in the protection layer.

5. The package according to claim 1, wherein a thickness of the redistribution layer above the first area is smaller than a thickness of the redistribution layer above the second area.

6. The package according to claim 1, wherein the redistribution layer structure further comprising:
 a third insulation layer disposing between the first insulation layer and the second insulation layer and between the redistribution layer and the second insulation layer, and the redistribution layer is disposed between the first insulation layer and the second insulation layer, wherein the second insulation layer is in contact with a top surface of the third insulation layer, a side surface of the third insulation layer, the top surface of the first insulation layer and the top surface of the die.

7. A package, comprising:
 a die, wherein a top surface of the die has a first area and a second area connected with the first area; and
 a redistribution layer structure comprising:
  a first insulation layer overlapping with the second area;
  a second insulation layer disposing above the first insulation layer and the die, wherein the second insulation layer covers and is in contact with a boundary between a side surface of the first insulation layer and the top surface of the die, wherein a cohesion between the second insulation layer and the top surface of the die is stronger than a cohesion between the first insulation layer and the top surface of the die; and
  a redistribution layer disposing above the die.

8. The package according to claim 7, wherein a material of the first insulation layer comprises polyimide, epoxy, acrylic resin, benzocyclobutene or polybenzoxazole.

9. The package according to claim 7, wherein the die comprises:
 a semiconductor substrate;
 a sensing component, disposed on the semiconductor substrate or embedded in the semiconductor substrate, wherein the first area is a sensing area overlapped with the sensing component, and the second area is a non-sensing area;
 a protection layer disposing above the semiconductor substrate, wherein the second insulation layer is in contact with the protection layer, and a cohesion between the second insulation layer and the protection layer is stronger than a cohesion between the first insulation layer and the protection layer; and conductive pads disposing on the semiconductor substrate, wherein the redistribution layer is electrically connected with the conductive pads through vias in the protection layer.

10. The package according to claim 9, wherein a material of the second insulation layer and a material of the protection layer comprise silicon nitride, silicon oxide, or a combination thereof.

11. The package according to claim 7, wherein the second insulation layer has an opening exposing the first area of the top surface of the die.

12. The package according to claim 7, wherein the second insulation layer covers the first area of the top surface of the die.

13. The package according to claim 7, wherein the redistribution layer structure further comprising:

a third insulation layer disposing between the first insulation layer and the second insulation layer and between the redistribution layer and the second insulation layer, and the redistribution layer is disposed between the first insulation layer and the second insulation layer, wherein the second insulation layer is in contact with a top surface of the third insulation layer, a side surface of the third insulation layer and the top surface of the first insulation layer.

14. A package, comprising:

a die, wherein a top surface of the die has a first area and a second area surrounding the first area; and a redistribution layer structure comprising:
a first insulation layer disposing above the second area and surrounding the first area;
a redistribution layer disposing above the first insulation layer;
a second insulation layer disposing above the redistribution layer and overlapping with the second area, wherein the second insulation layer covers and is in contact with a boundary between a side surface of the first insulation layer and the top surface of the die; and
a third insulation layer disposing between the first insulation layer and the second insulation layer and between the redistribution layer and the second insulation layer, wherein the second insulation layer covers and is in contact with a boundary between a side surface of the third insulation layer and a top surface of the first insulation layer.

15. The package according to claim 14, wherein a material of the first insulation layer and a material of the third insulation layer comprise polyimide, epoxy acrylic resin, benzocyclobutene or polybenzoxazole.

16. The package according to claim 14, wherein a material of the second insulation layer comprises polyimide, epoxy, acrylic resin, benzocyclobutene, polybenzoxazole, silicon nitride or silicon oxide.

17. The package according to claim 14, wherein the die comprises:

a semiconductor substrate;

a sensing component, disposed on the semiconductor substrate or embedded in the semiconductor substrate, wherein the first area is a sensing area overlapped with the sensing component, and the second area is a non-sensing area;

a protection layer disposing above the semiconductor substrate, wherein the second insulation layer is extending from a top surface of the third insulation layer to a top surface of the protection layer; and conductive pads disposing on the semiconductor substrate, wherein the redistribution layer is electrically connected with the conductive pads through vias in the protection layer.

18. The package according to claim 17, wherein a cohesion between the second insulation layer and the protection layer is stronger than a cohesion between the first insulation layer and the protection layer.

19. The package according to claim 14, wherein the third insulation layer has a multi-layer structure comprising a silicon nitride layer and a silicon oxide layer.

20. The package according to claim 14, wherein a thickness of the redistribution layer above the first area is smaller than a thickness of the redistribution layer above the second area.

* * * * *